(12) United States Patent
Miyajima et al.

(10) Patent No.: US 7,654,291 B2
(45) Date of Patent: Feb. 2, 2010

(54) PURGING APPARATUS AND PURGING METHOD

(75) Inventors: Toshihiko Miyajima, Tokyo (JP); Hiroshi Igarashi, Tokyo (JP); Hitoshi Suzuki, Tokyo (JP)

(73) Assignee: TDK Corporation, Tokyo (JP)

( * ) Notice: Subject to any disclaimer, the term of this patent is extended or adjusted under 35 U.S.C. 154(b) by 573 days.

(21) Appl. No.: 10/554,504

(22) PCT Filed: Apr. 28, 2004

(86) PCT No.: PCT/JP2004/006162

§ 371 (c)(1),
(2), (4) Date: Oct. 26, 2005

(87) PCT Pub. No.: WO2004/097927

PCT Pub. Date: Nov. 11, 2004

(65) Prior Publication Data

US 2006/0272169 A1     Dec. 7, 2006

(30) Foreign Application Priority Data

Apr. 28, 2003 (JP) .............................. 2003-123792
Jul. 11, 2003 (JP) .............................. 2003-273267

(51) Int. Cl.
*H01L 21/673* (2006.01)
*H01L 21/677* (2006.01)

(52) U.S. Cl. ............... 141/63; 141/4; 141/48; 141/51; 141/98; 206/710; 414/291; 414/935

(58) Field of Classification Search ............ 141/4, 141/11, 47–48, 51, 63, 65–66, 70, 85, 89, 141/91, 94, 98; 206/710–711; 414/288, 414/291, 935–941

See application file for complete search history.

(56) References Cited

U.S. PATENT DOCUMENTS 4,724,874 A   2/1988   Parikh et al.
5,575,081 A   11/1996  Ludwig (Continued)

FOREIGN PATENT DOCUMENTS

JP   6-69313   3/1994

(Continued)

OTHER PUBLICATIONS

U.S. Appl. No. 11/563,869, filed Nov. 28, 2006, Okabe.

(Continued)

*Primary Examiner*—Timothy L Maust
*Assistant Examiner*—Nicolas A Arnett
(74) *Attorney, Agent, or Firm*—Oblon, Spivak, McClelland, Miaer & Neustadt, L.L.P.

(57) ABSTRACT

It is an object of the present invention to easily and securely perform the removal operation of contaminant or the like from a wafer housed in a FOUP. To achieve the object, a purging apparatus of the present invention removes contaminant or the like from a wafer by moving a gas supply nozzle along a direction in which wafers are superimposed at the front of an opening while a lid of the FOUP is separated from a body and spraying clean gas on each wafer from the gas supply nozzle.

15 Claims, 20 Drawing Sheets

U.S. PATENT DOCUMENTS

| | | |
|---|---|---|
| 5,586,585 A | 12/1996 | Bonora et al. |
| 5,664,679 A | 9/1997 | Schneider et al. |
| 5,772,386 A | 6/1998 | Mages et al. |
| 5,810,062 A | 9/1998 | Bonora et al. |
| 5,988,233 A | 11/1999 | Fosnight et al. |
| 6,044,874 A * | 4/2000 | Saga .................. 141/63 |
| 6,056,026 A | 5/2000 | Fosnight et al. |
| 6,135,168 A | 10/2000 | Yang et al. |
| 6,164,664 A | 12/2000 | Fosnight et al. |
| 6,221,163 B1 * | 4/2001 | Roberson et al. ............ 141/85 |
| 6,319,297 B1 | 11/2001 | Fosnight |
| 6,808,352 B2 * | 10/2004 | Seita .................. 414/939 |
| 6,817,822 B2 | 11/2004 | Tokunaga |
| 6,867,153 B2 * | 3/2005 | Tokunaga .............. 141/63 |
| 6,883,539 B2 * | 4/2005 | Inoue et al. ............ 141/98 |
| 6,901,971 B2 * | 6/2005 | Speasl et al. ............ 141/1 |
| 7,077,173 B2 * | 7/2006 | Tokunaga .............. 141/66 |
| 2002/0064439 A1 * | 5/2002 | Otaguro ............... 414/217.1 |
| 2003/0049101 A1 * | 3/2003 | Seita ................. 414/217 |
| 2004/0182472 A1 * | 9/2004 | Aggarwal ............... 141/98 |

FOREIGN PATENT DOCUMENTS

| | | |
|---|---|---|
| JP | 7-45488 | 2/1995 |
| JP | 11-251422 | 9/1999 |
| JP | 11-307623 | 11/1999 |
| JP | 2001-7182 | 1/2001 |
| JP | 3180600 | 4/2001 |
| JP | 3252457 | 11/2001 |
| JP | 3277550 | 2/2002 |
| JP | 2002-170876 | 6/2002 |
| JP | 3331693 | 7/2002 |
| JP | 3355697 | 10/2002 |
| JP | 2002-353293 | 12/2002 |
| JP | 2002-368061 | 12/2002 |
| JP | 2003-45933 | 2/2003 |
| JP | 2004-200669 | 7/2004 |

OTHER PUBLICATIONS

U.S. Appl. No. 11/563,863, filed Nov. 28, 2006, Okabe.

* cited by examiner

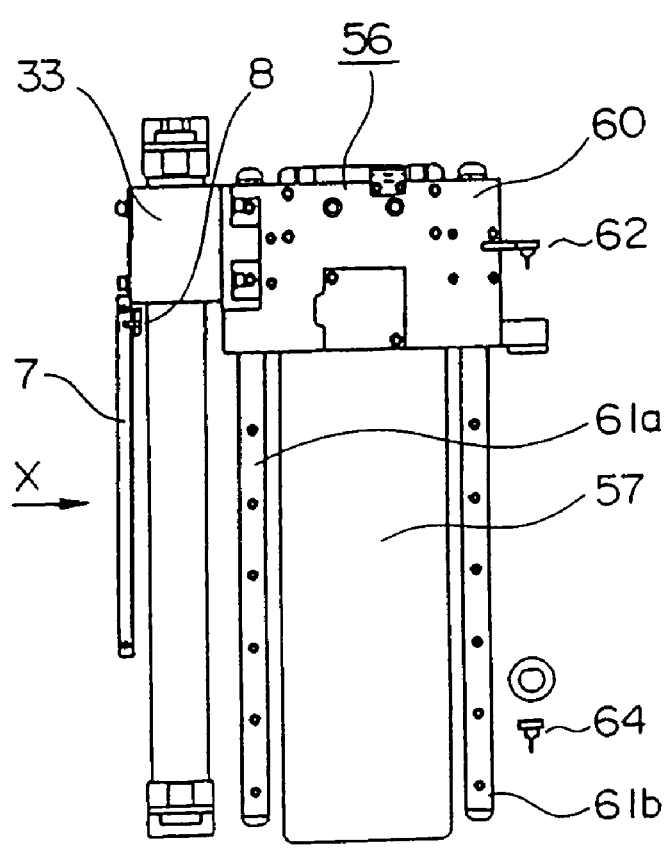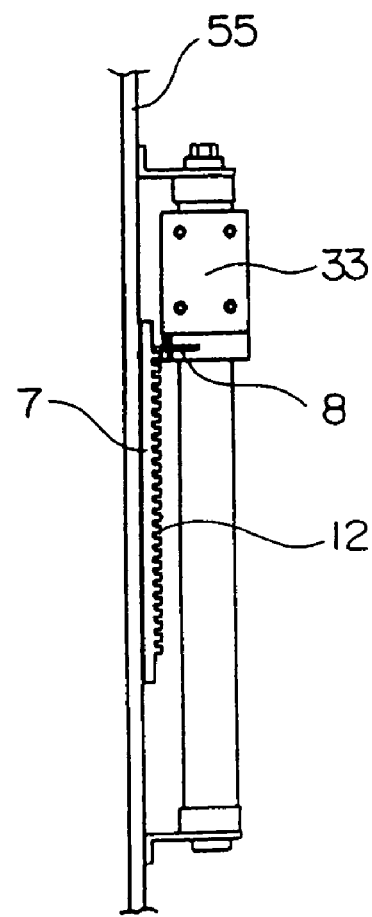
*FIG. 4A*  *FIG. 4B*

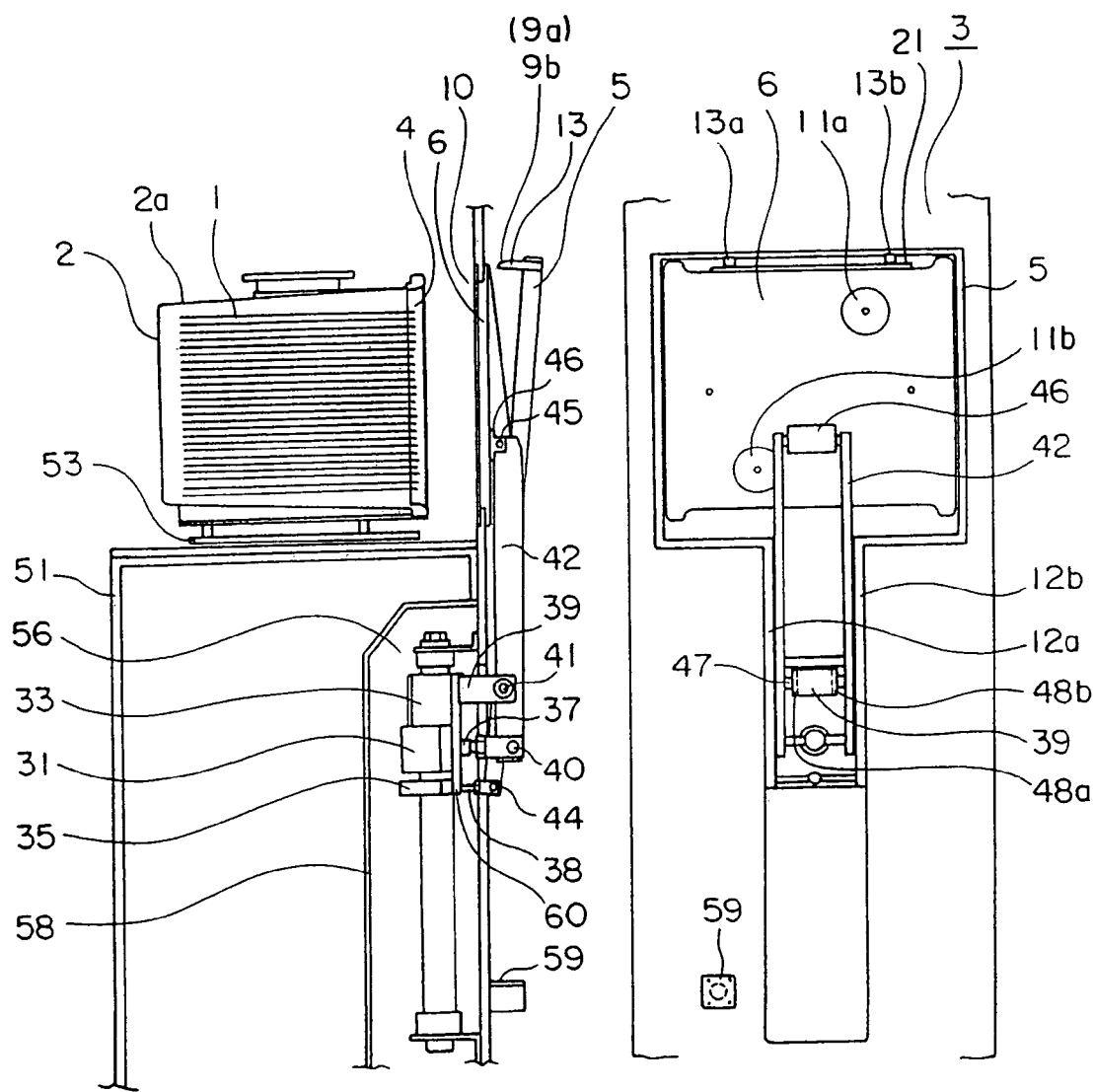
*FIG. 10A*  *FIG. 10B*

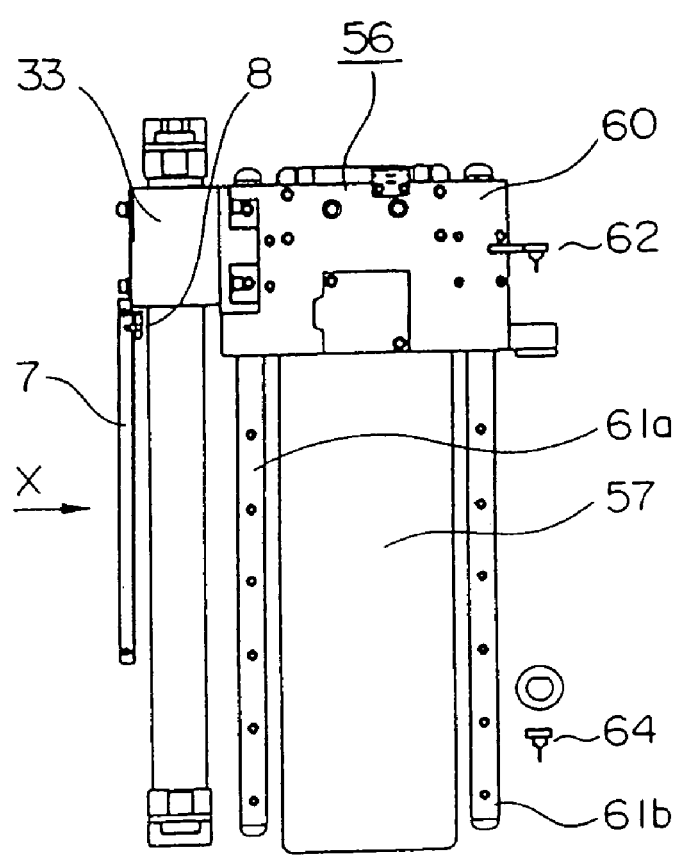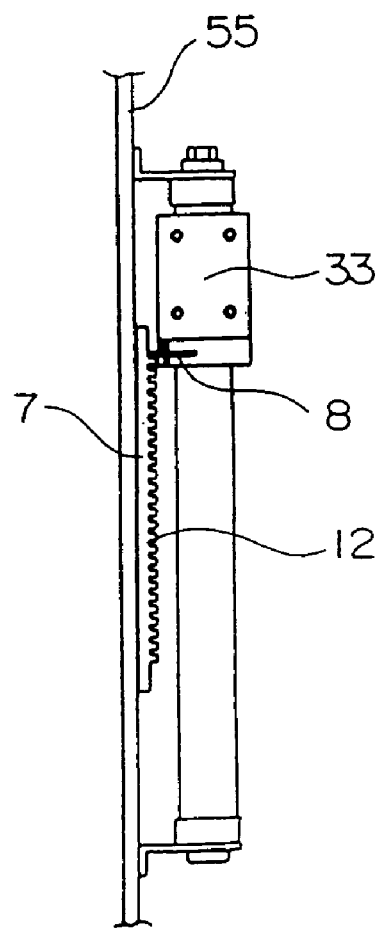
*FIG. 11A*          *FIG. 11B*

PURGING APPARATUS AND PURGING METHOD

TECHNICAL FIELD

The present invention relates to a product housing container used to house a product in a product manufacturing process in which the process of a semiconductor, panel for a flat panel display, optical disk, or the like is performed in a high clean environment. More minutely, the present invention relates to a cleaning method of the inside of the so-called FOUP (front-opening unified pod) used in a process for treating a semiconductor wafer mainly having a diameter of 300 mm as a product to be housed.

BACKGROUND ART

A process for fabricating a semiconductor device has dealt with the issue of cleanliness required in such processes by forming the whole plant for applying various treatments to a wafer into a clean room. However, because the diameter of a wafer is increased, the above method becomes a problem in cost to obtain the high clean environment. Means for securing a mini-environment (very small environment) space keeping a high cleaning degree has been taken for various treating apparatuses in these several years.

Specifically, instead of increasing the cleaning degree of the entire factory, only insides of treating apparatuses and inside of a storing container (hereafter referred to as pod) during movement between them in a manufacturing process are kept at a high cleaning degree. This pod is referred to as FOUP as described above. Thus, by bringing a small space into a high cleaning degree, the advantage same as the case of forming the whole plant into a clean room is obtained, equipment investment and maintenance cost are reduced, and an efficient production process is realized.

A semiconductor treating apparatus or the like dealing with the so-called mini-environment system actually used is briefly described below. FIG. 15 shows the whole of a semiconductor wafer treating apparatus 50. The semiconductor wafer treating apparatus 50 is mainly constituted of a load port portion 51, a conveying chamber 52, and treating chamber 59. Junctions therebetween are comparted by a load-port-side compartment 55a and cover 58a, and treating-chamber-side compartment 55b and cover 58b. In the conveying chamber 52 in the semiconductor wafer treating apparatus 50, to discharge dust and keep a high cleaning degree, an air flow is generated from the upper portion toward the lower portion of the chamber 52 by a fan (not illustrated) set on the chamber. Thus, dust is continuously discharged toward the lower side.

On the load port portion 51, a pod 2 serving as a container for storing a silicon wafer (hereafter referred to as wafer) or the like is set on a pedestal 53. As previously described, the inside of the conveying chamber 52 is kept at a high cleaning degree in order to treat a wafer 1 and moreover, a robot arm 54 is set to the inside. This robot arm 54 moves the wafer between the inside of the pod 2 and the inside of the treating chamber 59. Various mechanisms for forming a thin film on the surface of the wafer or the like and treating the thin film are generally included in the treating chamber 59 but description of these configurations is omitted because they are not directly related to the present invention.

The pod 2 has a space for storing the wafer 1 which is a product to be treated at the inside and includes a boxy body portion 2a having an opening on any face and a lid 4 for closing the opening. A shelf having a plurality of stages for overlapping wafers 1 in one direction is set in the body portion 2a and wafers 1 mounted on the stages are housed in the pod 2 by making intervals between the wafers 1 constant. In the case of the example shown here, the direction for overlapping the wafers 1 is vertical. An opening 10 is formed at the load port portion 51-side of the conveying chamber 52. The opening 10 is set to a position facing the opening of the pod 2 when the pod 2 is set on the load port portion 51 so as to be close to the opening 10. An opener 3 to be described later is also set nearby the opening 10 in the conveying chamber 52.

FIGS. 16A and 16B show a side sectional view obtained by enlarging the opener-3 portion in a conventional apparatus and a front view viewing the opener 3 from the conveying chamber-52 side. FIG. 17 shows a schematic view of the side cross section of a state in which the lid 4 is removed from the pod 2 by using the opener 3. The opener 3 has a door 6 and a door arm 42. A fixed member 46 is set to the door 6 and the door 6 is rotatably connected to one end of the door arm 42 through the fixed member 46. The other end of the door arm 42 is supported to the front end of a rod 37 which is a part of a pneumatic cylinder 31 rotatably through a pivot 40.

A through-hole is formed between one end of and the other end of the door arm 42. A fulcrum 41 is constituted by the fact that a not-illustrated pin passes through the through-hole and a hole of a fixed portion 39 fixed to a support member 60 of a movable portion 56 for vertically moving the opener 3. Therefore, the door arm 42 becomes rotatable about the fulcrum 41 in accordance with the telescopic motion of the rod 37 due to driving by the cylinder 31. The fulcrum 41 of the door arm 42 is fixed to the support member 60 set to the movable portion 56 which can be vertically moved. The door 6 has holding ports 11a and 11b and is able to hold the lid 4 of the pod 2 by means of vacuum attraction.

To treat the wafer 1 with these configurations, the pod 2 is set on the pedestal 53 so as to be close to the conveying-chamber opening 10 to hold the lid 4 by the door 6. Then, when contracting the rod of the cylinder 31, the door arm 42 moves so as to leave the conveying-chamber opening 10 about the fulcrum 41. The door 6 rotates together with the lid 4 to remove the lid 4 from the pod 2 in accordance with the above operation. The state is shown in FIG. 17. Thereafter, the movable portion 56 is lowered to convey the lid 4 up to a predetermined evacuation position.

The inside of the pod 2 while housing a wafer or the like is filled with dry nitrogen or the like controlled at a high cleaning degree to prevent contaminant, oxidizing gas or the like from entering the pod. However, because the pod also houses a wafer after passing through the treating chamber, a case is considered in which contaminant or the like attaches to the wafer in the treating chamber or the like and this is brought into the pod. When the contaminant or the like is brought into the next treating chamber, a case may occur in which a desired wafer treatment which should be originally performed may not be performed when passing through the treating chamber. Therefore, when moving the wafer from the pod to the conveying chamber, it is necessary to remove the contaminant or the like.

In the case of a conventional FOUP, to deal with the above request, an inlet hole for introducing purging gas into the pod and an outlet hole for discharging the purging gas are formed at the bottom of the FOUP. These inlet and outlet holes are respectively connected with an inlet hole and outlet hole for purging gas set on a support pedestal on which the pod is mounted. As an actual operation, a high-pressure gas controlled at a high cleaning degree is introduced into the pod from the support pedestal side through these inlet holes. At the same time, the gas and contaminant present in the pod are discharged to the outside of the pod through these outlet holes. Contaminant or the like brought into the pod has been removed in accordance with the operation.

However, only by introducing a high-pressure gas from the bottom of the pod, it is considered that a gas flow mainly passes through a portion nearby the outer periphery of a wafer through which gas easily passes. Therefore, it is considered that it is difficult to pass a gas having a sufficient flow rate through the upper and lower faces of individual wafers held by keeping very small intervals. However, contaminant or the like is mainly attached to the upper face or lower face of a wafer and therefore, it is considered that it is difficult to sufficiently remove contaminant or the like by a conventional method.

To securely remove the contaminant from a wafer, the method disclosed in Japanese Patent Application Laid-Open No. 2003-45933 is proposed. In the case of this method, a space for housing an opener is formed separately from a conveying chamber. The space has a gas supply port at the front upper portion of the opening of a pod. Clean gas is supplied into the pod from the gas supply port and the clean gas circulating through the pod and discharged to the space from the bottom of the pod is exhausted from the bottom of the space. By using the above configuration and thereby circulating the clean gas through the pod, it is possible to more securely remove contaminant or the like, compared with the case of the conventional method.

Moreover, Japanese Patent Application Laid-Open No. 11-251422 discloses a method for introducing clean gas between wafers held in a pod. In the case of this method, a gas introducing channel and a gas discharging channel communicating with groove portions for supporting wafers are formed in the pod. By spraying clean gas on the surface of each wafer through the gas introducing channel and discharging the clean gas containing contaminant or the like through the gas discharging channel, it is possible to more securely remove the contaminant.

In the case of the method disclosed in Japanese Patent Application Laid-Open No. 2003-45933, an effect can be expected on reduction of humidity and of an oxidizing gas in a pad and prevention of organic contamination to a certain extent. However, it is considered that it is also difficult to effectively replace the gas present between wafers held by keeping very small spaces. Therefore, it is considered that it is also difficult to obtain an effect for removing contaminant attached to the upper and lower faces of a wafer.

According to the method disclosed in Japanese Patent Application Laid-Open No. 11-251422, it is considered that it is possible to remove contaminant attached to upper and lower faces of a wafer. However, it is considered that it is difficult to keep the inside diameter of a gas introducing channel at a large value from the viewpoint of an actual configuration. Therefore, a difference occurs in a gas pressures introduced on the surface of a wafer or times introduced at a predetermined pressure at the upstream side and downstream side of the channel and it is considered that the contaminant removal effect depends on a wafer holding position.

Moreover, arrangement of a support pedestal, pod shape, and holes for supplying and discharging clean gas for purging inside of pod is almost standardized in the semiconductor manufacturing business circle. Therefore, the pod disclosed in Japanese Patent Application Laid-Open No. 11-251422 requiring a configuration different from the standard has a problem that the pod cannot be shared with a support pedestal generally used at present.

DISCLOSURE OF THE INVENTION

The present invention is made in view of the above situation and its object is to provide a purging method and a purging apparatus for a FOUP capable of effectively removing a contaminant or the like attached on a wafer.

To solve the above problems, a purging apparatus of the present invention is a purging apparatus for applying the purging operation to an object housed in a pod having, a body constituted of an opening and a plurality of shelves on which objects to be housed are arranged in a predetermined direction, and a lid capable of being separated from the body and closing the opening, by spraying predetermined gas on the object to be housed, characterized by having a frame capable of moving the front of the opening in the predetermined direction and a gas supply nozzle movable in a predetermined direction by keeping a predetermined positional relation with the frame while the lid is separated from the body.

In the case of the above purging apparatus, it is also allowed that the frame holds a sensor for mapping the object housed in the pod and the gas supply nozzle is set in parallel with the sensor. Moreover, in the case of the above purging apparatus, it is also allowed to synchronize the timing at which the predetermined gas is sprayed from the gas supply nozzle with the timing at which the gas supply nozzle passes through a plane on which the object to be housed extends when the gas supply nozzle moves in the predetermined direction. Furthermore, in the case of the above purging apparatus, it is allowed that the gas supply nozzle spouts the predetermined gas in a direction parallel with the plane on which the object to be housed extends or a direction facing downward by a predetermined angle from the plane.

Furthermore, in the case of the above purging apparatus, the object to be housed corresponds to a wafer used for semiconductor fabrication or each of various products which is treated under a high-clean environment. In the case of the pod, there is a FOUP as an example which houses a semiconductor wafer. However, the example is not restricted to the FOUP as long as it houses various products. Moreover, a state in which the lid is separated from the body corresponds to a state in which the pod is mounted on a load port and a wafer housed in the pod is transferred to a wafer treating apparatus through the load port. Furthermore, the purging operation described above represents an operation for removing contaminant such as dust, organic substance, impurity element, or oxidizing gas. Furthermore, mapping represents an operation for detecting presence or absence of a wafer housed in each stage of a shelf and relating the wafer to positional information of the shelf.

Furthermore, to solve the above problem, a purging apparatus of the present invention is a purging apparatus for applying the purging operation to an object housed in a pod having, a body constituted of an opening and a plurality of shelves arranged in a predetermined direction on which objects to be housed are mounted and a lid separable from the body to close the opening, by spraying predetermined gas on the object to be housed, characterized by including a gas supply nozzle which is separated from an end of the object to be housed by a predetermined distance and almost uniformly sprays the predetermined gas on almost the whole area of a face extending vertically to the predetermined direction of the objects to be housed and a support member capable of driving the gas supply nozzle in the predetermined direction by supporting the gas supply nozzle.

In the case of the above purging apparatus, it is preferable that the support member is a member for setting or removing the lid to or from the body portion of the pod. Moreover, it is preferable that the timing at which the predetermined gas is spouted from the gas supply nozzle synchronizes with the timing at which the support member passes through the plane on which the object to be housed extends when the support member moves in the predetermined direction. Furthermore, it is preferable that the gas supply nozzle spouts the predetermined gas to an area surrounded by a face parallel with a plane on which the object to be housed extends and a face extending downward by a predetermined angle from the plane.

In the case of the above purging apparatus, the object to be housed corresponds to a wafer used for semiconductor fabrication or each product which is treated under a high-clean environment. Moreover, though the pod is a FOUP as an example for housing a semiconductor wafer, the example is not restricted to the FOUP as long as it houses various products. Furthermore, a state in which the lid is separated from the body corresponds to a state in which the pod is mounted on a load port and a wafer housed in the pod is transferred to a wafer treating apparatus through the load port. Furthermore, the above purging operation represents an operation for removing contaminant such as dust, organic substance, impurity element, oxidizing gas or the like, present by attaching to a product or the like. Furthermore, mapping represents an operation for detecting presence or absence of a wafer housed in each stage of a shelf and relating the wafer to the positional information on the shelf.

To solve the above problem, a purging method of the present invention is a purging method for applying the purging operation to an object housed in a pod having, a body constituted of an opening and a plurality of shelves arranged in a predetermined direction on which objects to be housed are mounted, and a lid separable from the body to close the opening, by spraying predetermined gas on the object to be housed, characterized by including a step of separating the lid from the body, and purging the object to be housed by moving a gas supply nozzle along the predetermined direction at the front of the opening, and spraying predetermined gas on the object to be housed from the gas supply nozzle.

In the case of the above purging method, it is also allowed that the gas supply nozzle is set in parallel with a sensor and a step of performing purging and a step of mapping an object housed in the pod by the sensor are simultaneously performed. Moreover, in the case of the above purging method, it is also allowed that the step of performing purging is performed synchronously with the timing at which the gas supply nozzle passes through a plane on which the object to be housed extends when the gas supply nozzle moves in the predetermined direction. Furthermore, in the case of the above purging method, at the step of performing purging, it is also allowed that the gas supply nozzle spouts the predetermined gas in a direction parallel with a plane on which the object to be housed extends or a direction facing downward by a predetermined angle.

In the case of the above purging method, the object to be housed corresponds to a wafer used for semiconductor fabrication or various products which are treated under a high-clean environment. Moreover, the pod is a FOUP as an example for housing a semiconductor wafer. However, the example is not restricted to the FOUP as long as it houses various products. Moreover, a state in which the lid is separated from the body corresponds to a state in which a wafer housed in the pod is transferred to a wafer treating apparatus through a load port. Furthermore, the above-described purging operation represents an operation for removing contaminant such as dust, organic substance, impurity element, oxidizing gas or the like present by attaching onto a product. Moreover, mapping represents an operation for detecting presence or absence of a wafer housed in each stage of a shelf and relating the wafer to the positional information on the shelf.

Moreover, to solve the above problem, a purging method of the present invention is a purging method for applying the purging operation to an object housed in a pod having a body constituted of an opening and a plurality of shelves arranged in a predetermined direction on which objects to be housed are mounted, and a lid separable from the body to close the opening, by spraying predetermined gas on the object, characterized by including a step of separating the lid from the body, a step of holding a state in which the front of the opening is separated from an end of the object to be housed by a predetermined distance and thereby moving a gas supply nozzle along the predetermined direction, and a step of almost uniformly spraying the predetermined gas on almost the whole area of a face extending in a direction vertical to the, predetermined direction of the object to be housed by the gas supply nozzle and thereby purging the object to be housed.

In the case of the above purging method, it is preferable that the gas supply nozzle is fixed to a door for setting or removing the lid to or from the body of the pod. Moreover, the step of performing purging is performed synchronously with the timing at which the gas supply nozzle passes through a plane on which the object to be housed extends when the gas supply nozzle moves in a predetermined direction. Furthermore, in the step of performing purging, the gas supply nozzle spouts the predetermined gas between a face parallel with a plane on which the object to be housed extends and a face extending by facing downward by a predetermined angle from the plane.

In the case of the above purging method, the object to be housed corresponds to a wafer used for semiconductor fabrication or various products which are treated under a high-clean environment. Moreover, the pod is a FOUP as an example for housing a semiconductor wafer. However, the example is not restricted to the FOUP as long as it houses various products. Moreover, a state in which the pod is separated from the body corresponds to a state in which the pod is mounted on a load port and a wafer housed in the pod is moved to a wafer treating apparatus through the load port. Furthermore, the above-described purging operation represents an operation for removing contaminant such as dust, organic substance, impurity element, oxidizing gas or the like present by attaching onto a product. Furthermore, mapping represents an operation for detecting presence or absence of a wafer housed in each stage of a shelf and relating the wafer to the positional information on the shelf.

According to the present invention, it is possible that a gas supply nozzle enters a pod from a pod opening to spray high clean gas on the surface of a wafer. Moreover, the gas supply nozzle can move in a direction in which wafers are superimposed and individually spray gas on each wafer. Therefore, it is possible to effectively and securely remove contaminant such as dust or impurity attached to the surface of a wafer. Moreover, it is possible to perform the operation for purging the inside of the pod any time during wafer treatment by using the gas supply nozzle and hold a wafer under a cleaner environment. Furthermore, the present invention can be executed for a mapping apparatus of an existing FOUP system by only adding a gas supply nozzle and a gas pipe, and can be set to a standardized system easily and inexpensively.

Furthermore, according to the present invention, a gas supply nozzle can spray high clean gas on the whole area of the surface of a wafer by keeping a predetermined distance from the wafer. Furthermore, the gas supply nozzle can move in a direction in which wafers are superimposed and it is possible to individually spray each wafer with gas. Therefore, it is possible to effectively and securely remove contaminant such as dust or impurity attached to the surface of a wafer. Moreover, it is possible to perform the operation for purging the inside of a pod any time during wafer treatment by using a gas supply nozzle and hold a wafer under a cleaner environment. Furthermore, it is possible to execute the present invention for the door of a load port of an existing FOUR system by only adding a gas supply nozzle and a gas pipe and inexpensively and easily set the present invention to a standardized system.

BRIEF DESCRIPTION OF THE DRAWINGS

FIG. 4A is a front view of a movable portion of an opener of an example of the above embodiment viewed from the load port side;

FIG. 4B is an illustration showing the configuration shown in FIG. 3A viewed from a side;

FIG. 10A is an illustration showing a schematic configuration when contracting the opener shown in FIGS. 8A to 8C and the configuration nearby the opener and viewing them from a side;.

FIG. 10B is an illustration showing a schematic configuration when viewing the configuration shown in FIG. 10A from the conveying chamber side;

FIG. 11A is a front view of the movable portion of an opener of an example relating to the above embodiment viewed from the load port side;

FIG. 11B is an illustration showing the configuration shown in FIG. 11A viewed from a side;

BEST MODE FOR CARRYING OUT THE INVENTION

FIRST EMBODIMENT

First embodiment of the present invention is described below by referring to the accompanying drawings.

Figure 1:
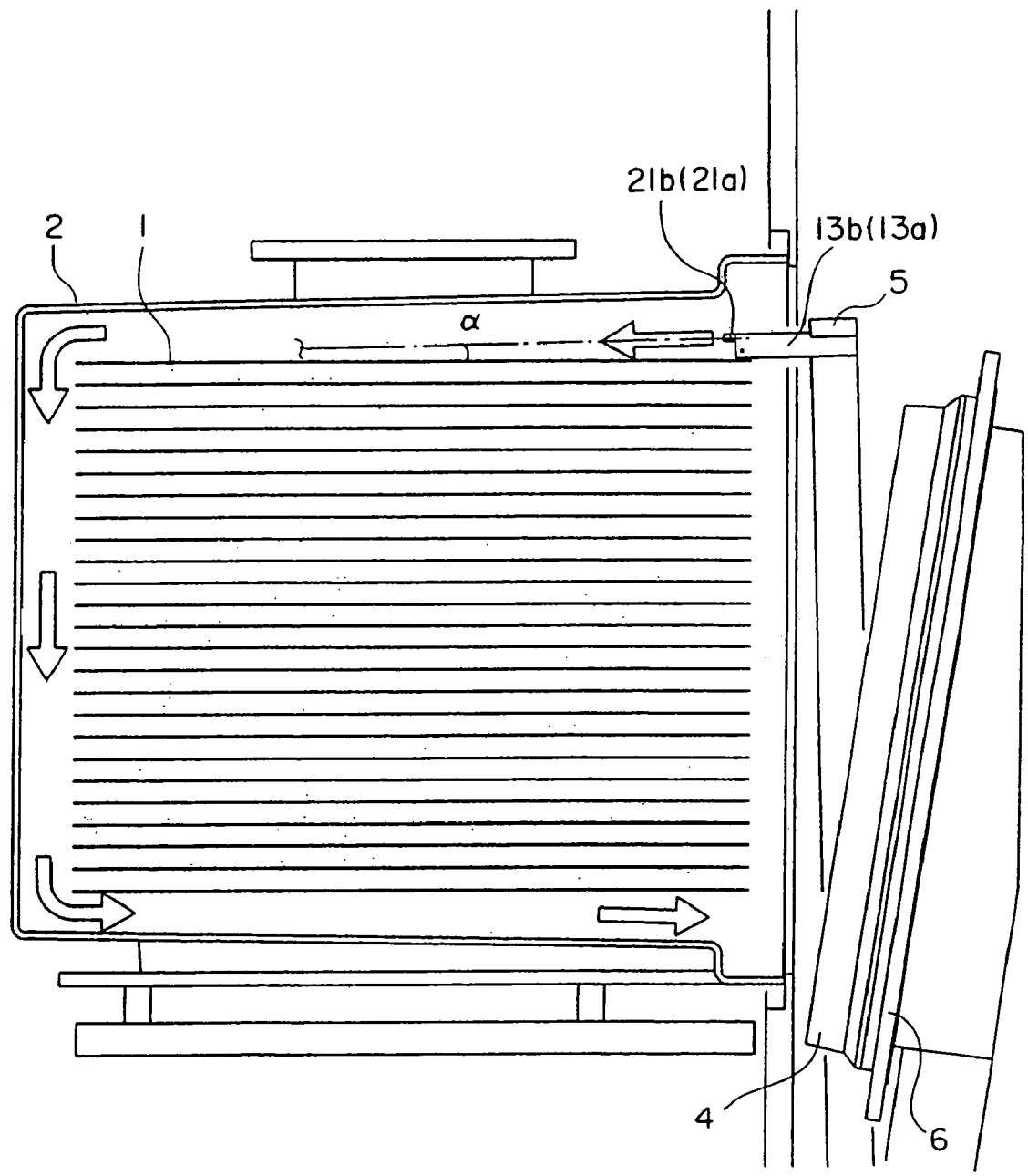
FIG. 1 is an illustration showing a purging apparatus, a pod, a pod lid, and a part of an opener of first embodiment of the present invention and showing a schematic configuration of them when viewed from a side.
Figure 2:
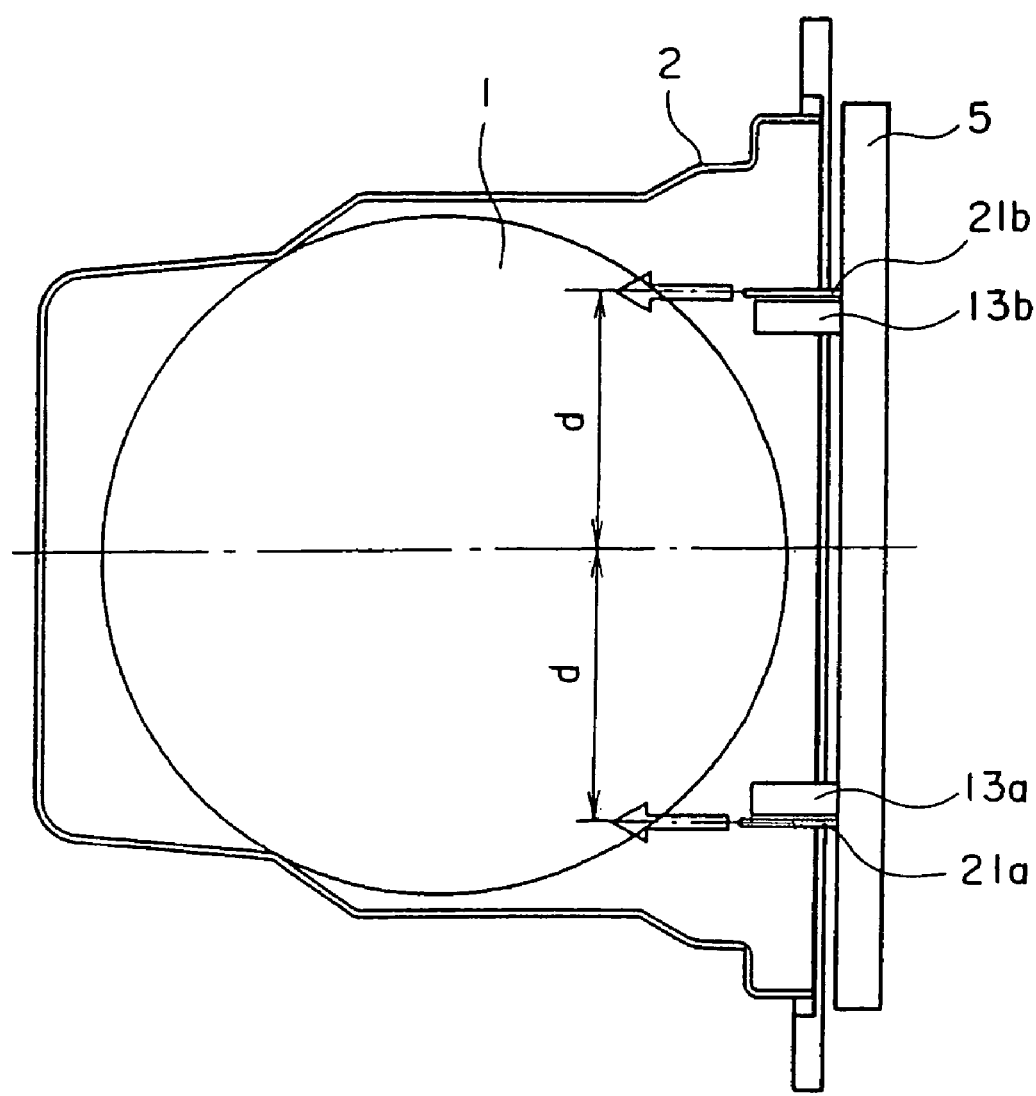
FIG. 2 is an illustration showing a schematic configuration when viewing a purging apparatus and configuration set to the periphery of the first embodiment of the present invention from the upper portion.

FIG. 1 shows a schematic configuration of a purging apparatus of the present invention, which is an illustration showing the outline when viewing a pod, a wafer housed in the pod, and a purging apparatus of the present invention from a side. FIG. 2 is an illustration showing the outline of an essential portion when viewing each configuration shown in FIG. 1 and configurations following each configuration from above. Various configurations such as a shelf for supporting a wafer and sealing member set between a lid and a pod and the like are originally included in the pod and various configurations follow a door. However, because these configurations are not directly related to the present invention, detailed illustration and description are omitted.

In FIG. 1, a frame 5 constituted of a frame member is set so as to surround the circumference of a door 6 of an opener. A pair of sticks 13*a* and 13*b* shown in FIG. 2 are set on the frame 5. These sticks 13*a* and 13*b* head for the inside of a pod 2 from the opening face of the pod 2 and extend in a direction almost vertical to the opening face. The sticks 13a and 13b support gas supply nozzles 21a and 21b so that the nozzles 21a and 21b head for the direction same as that of the sticks. A not-illustrated gas supply line is connected to each of the gas supply nozzles 21a and 21b and thereby, it is possible to supply a clean gas to the nozzles in accordance with an operation from the outside. These gas supply nozzles 21a and 21b are sequentially moved in a direction in which wafers 1 are superimposed to supply a clean gas between the wafers 1. As a result, the removal operation of contaminant in the surface and back of a wafer and the inside of the pod 2 by a clean gas, the so-called purging operation is performed.

In the case of this embodiment, the gas supply nozzles 21a and 21b are set to a position which becomes an object of the central line of the pod 2, that is, the central line of the wafer 1 held in the pod separated by a predetermined interval d. Moreover, the nozzles 21a and 21b are fixed to their corresponding sticks 13a and 13b so that gas can be supplied by facing in parallel with the surface of the wafer 1 or downward by a predetermined angle a. It is preferable that these interval d and angle a are properly adjusted so that contaminant on the wafer 1 can be more effectively removed and this can be discharged from the pod 2 in accordance with the interval between wafers held by the pod 2 and the shape of the pod 2. Furthermore, from the same reason it is also allowed to use a configuration for changing the number of nozzles by the example concerned or make a nozzle drivable.

In the case of the present invention, it is possible to remove contaminant or the like from each wafer and hold a wafer in a pod at a cleaning degree higher than ever. Moreover, in the case of the present invention, it is possible to control a gas flow rate and purging time required to remove contaminant or the like for each wafer. Therefore, it is also possible to always remove contaminant at a constant condition and easily keep the control state of every wafer in a pod constant.

It is also allowed to discharge the gas supplied into the pod 2 by the gas supply nozzles 21a and 21b by using an exhaust hole which is conventionally set to the pod 2. Moreover, because the purging operation is performed while the lid 4 is opened, it is allowed to perform the purging operation by using a not-illustrated exhaust system set in the conveying chamber. Furthermore, it is considered that it is preferable to prevent contaminant or the like once removed from a wafer from being reattached to the inside of a pod or from entering the conveying chamber. In this case, as shown in the above-described Japanese Patent Application Laid-Open No. 2003-45933, it is allowed to set a small chamber dedicated to exhaust communicating with a pod opening in a conveying chamber in order to efficiently exhaust the clean gas used to remove contaminant or the like.

As described above, it is preferable that the contaminant or the like once removed from the surface of a wafer is quickly conveyed to the outside of a pod. Therefore, to more effectively remove contaminant, it is considered to add a port dedicated to exhaust corresponding to each wafer as shown in the above-described Japanese Patent Application Laid-Open No. 11-251422. However, addition of this configuration requires a large standard change of a pod corresponding to the standard. Therefore, when using the present invention for a system relating to a FOUP presently used, it is considered that it is preferable not to use the above exhaust port.

Moreover, a case is considered in which contaminant or the like attaches to a wafer in the form of dust. It is considered that this dust is electrified and frequently attaches to a wafer due to electrostatic attracting force. In the case of this dust, by spraying ionized gas on a wafer instead of high clean gas, it is possible to more efficiently remove the dust. Therefore, it is more preferable to use a configuration capable of supplying an ionized gas according to necessity by adding the so-called ionizer for ionizing gas to a gas supply nozzle or nearby the nozzle.

(An Example to which this Embodiment is Applied)

Then, a case of applying a purging apparatus of the present invention to a system relating to a presently-used FOUP is described by referring to the accompanying drawings. Since, a semiconductor wafer treating apparatus to which the present invention is applied and a pod whose schematic configurations are almost the same as the configurations described for the prior art, description of the same configuration is omitted. A configuration for performing the mapping operation of a wafer held in the pod 2 is frequently added to the opener 3. The configuration includes a pair of transmission sensors for detecting presence or absence of a wafer, a frame for supporting the sensors, a mechanism for driving the frame, a mechanism for detecting the present position of the sensor and the like. In the case of this applied example, the present invention can be more easily executed by commonizing the frame 5 for supporting a gas supply nozzle of the present invention with the frame for supporting the transmission sensors.

Figures 3A, 3B:
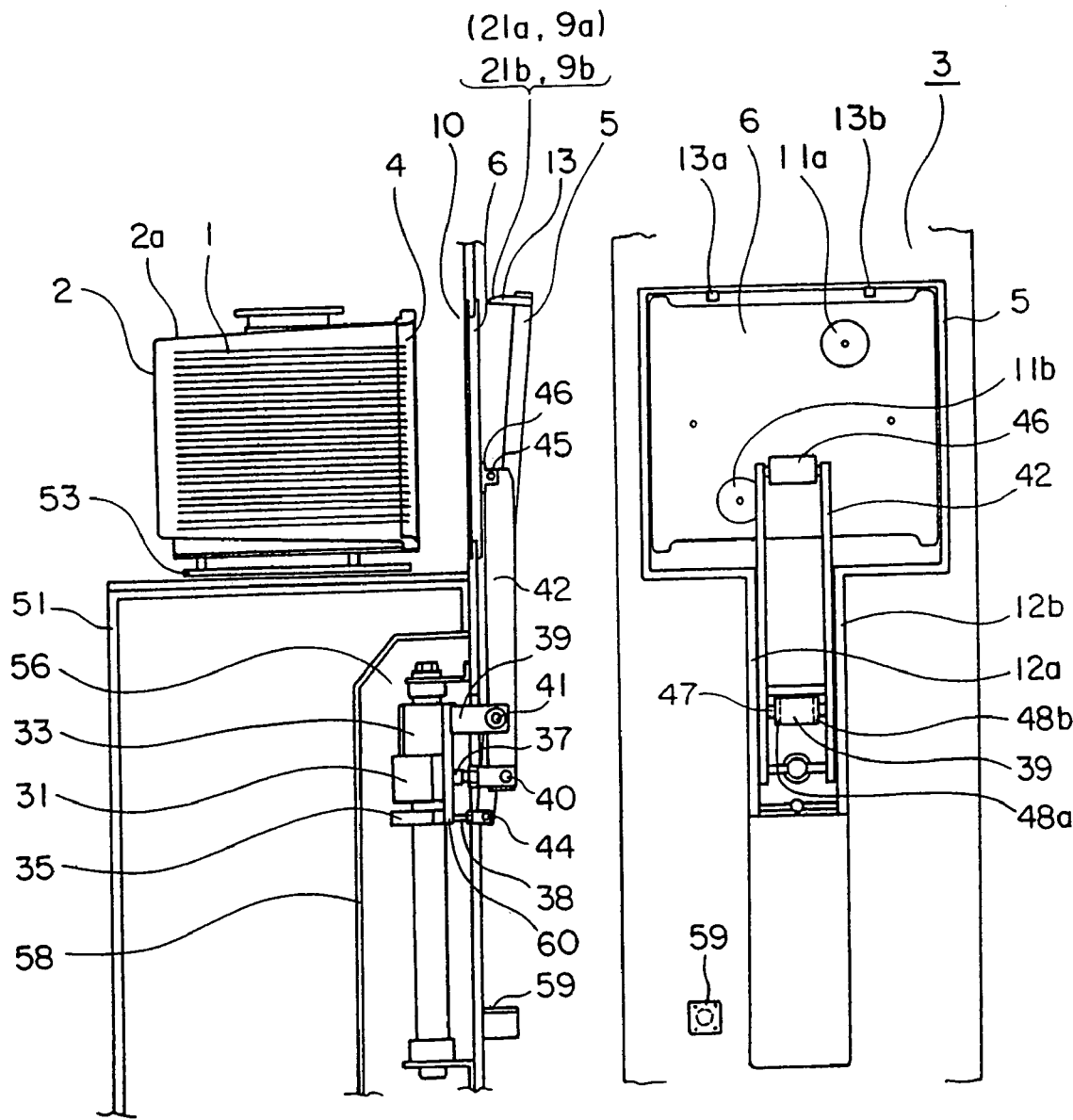
FIG. 3A is an illustration showing a schematic configuration when contracting the opener and its nearby configuration and viewing them from a side.
FIG. 3B is an illustration showing a schematic configuration when viewing the configuration shown in FIG. 3A from the conveying chamber side.

In the case of a schematic configuration of the wafer treating apparatus 50, a conveying-chamber opening 10 slightly larger than the lid 4 of the pod 2 is formed at the load port portion-51 side in the conveying chamber 52 as shown in FIG. 8 as the prior art. The opener 3 for opening/closing the lid 4 of the pod 2 is set to the conveying-chamber opening-10 side in the conveying chamber 52. In this case, by referring to FIGS. 3A and 3B, the opener to which the present invention is applied is described. FIG. 3A is an illustration showing the whole of an apparatus by contracting the portion of the load port portion 51, pod 2, opener 3, and lid 4 in FIG. 1 and FIG. 3B is an illustration when viewing configuration shown in FIG. 3A from the inside of the conveying chamber 52.

The opener 3 has the door 6 and frame 5. The door 6 is a plate having a size for closing the conveying-chamber opening 10 and holding portions 11a and 11b serving as vacuum attraction holes are formed on the face of the plate. When the door 6 closes the conveying-chamber opening 10, a face located at the pod-2 side is a plane capable of closely contacting with the lid 4. The fixed member 46 having a hole is set to the door 6. The door 6 is fixed by the fact that a pivot 45 set at the upper end of the door arm 42 rotatably passes through the hole. A hole is formed at the lower end of the door arm 42. The pivot 40 passes through the hole and a hole present at the front end of the rod 37 serving as a part of the pneumatic door-opening/closing cylinder 31 serving as a door-opening/closing drive. Thereby, the door arm 42 is connected with the cylinder 31 and rotatably supported by the cylinder 31.

The frame 5 is a structure constituted of a frame member set so as to surround the door 6 along the conveying-chamber opening 10. The frame 5 is set to upper ends of frame arms 12a and 12b extending on the frame member under the frame 5. A not-illustrated hole is formed at the lower ends of the frame arms 12a and 12b. A pivot 44 passes through the hole and a hole at the front end of a rod 38 serving as a part of a pneumatic frame driving cylinder 35 serving as a frame drive. Thereby, these frame arms are connected with a cylinder 35 and are rotatably supported by the cylinder 35.

The frame arms 12a and 12b are vertically extended symmetrically and in parallel along the central axis of the frame 5. A rod 47 vertical to the frame arms 12a and 12b is set between upper ends and lower ends of the frame arms 12a and 12b. A fixed member 39 serving as a fulcrum support portion vertically extended from the support member 60 is set to the support member 60. The fixed member 39 has a through-hole parallel with the support member 60. A bearing (not illustrated) is set to the through-hole of the fixed member 39 and the outer ring of the bearing is rotatably supported by the inner wall of the through-hole and the inner ring of the bearing rotatably supports the rod 47. Thereby, the rod 47 constitutes the fulcrum 41 while it is included in the through-hole of the fixed member 39.

The fulcrum 41 is constituted as a fulcrum on the same axis serving as the fulcrums of the arm frames 12a and 12b and the fulcrum of the door arm in common. That is, another through-hole is formed between the upper end and the lower end of the door arm 42. The fulcrum 41 is constituted by passing the rod 47 through the through-hole. The door arm 42 can rotate about the fulcrum 41 by the telescopic motion of the rod 37 according to driving by the cylinder 31. The fulcrum 41 of the door arm 42 is fixed to the support member 60 set to the movable portion 56 which can be vertically moved. The door 6 has holding ports 11a and 11b and is able to hold the lid 4 of the pod 2 by means of vacuum attraction. The door arm 42 is set so as to be almost vertical while pressing the door 6 against the conveying-chamber opening 10 (hereafter referred to as standby state) and the door 6 moved in a direction separate from the wall surface of the conveying chamber 52 by rotating the door arm 42.

The frame arms 12a and 12b can rotate about the fulcrum 41 in accordance with the telescopic motion of the rod 38 in accordance with driving by the frame driving cylinder 35. That is, the frame arms 12a and 12b are also fixed to the support member 60 set to the movable portion 56 which can be vertically moved. The frame 5 is set so as to diagonally separate from the wall surface of the conveying chamber 52 when the door 6 is kept in a standby state. That is, under the above state, the frame arms 12a and 12b are diagonally supported so as to have a certain angle from the door arm 42 and the upper portion of the frame 5 is separate from the wall surface of the conveying chamber 52 by a certain distance. When the frame 5 rotates the frame arms 12a and 12b in a direction to be contacted with the wall surface of the conveying chamber 52, the frame 5 almost contacts with the wall surface of the conveying chamber 52.

Support rods 13a and 13b are fixed to a frame member set to the upper portion of the frame 5 so as to protrude toward the wall surface of the conveying chamber 52. Transmission sensors 9a and 9b serving as first transmission sensors are set to front ends of the support rods 13a and 13b so as to be faced each other and the gas supply nozzles 21a and 21b are set so as to satisfy the above positional relation.

The movable portion 56 for vertically moving the opener 3 is set to the semiconductor-wafer treating apparatus 50. FIG. 4A is an illustration when viewing the movable portion 56 of the opener 3 from the load port portion-51 side and FIG. 4B is an illustration showing the arrow view X in FIG. 4A. The movable portion 56 includes a pneumatic rod-less cylinder 33 for vertically moving and the support member 60 and is set below the downside of the pod 2 so that the portion 56 is brought to the downstream side of air flow from the pod 2. The fixed member 39, pneumatic cylinder 31, and cylinder 35 are set to the support member 60. The movable portion 56 is set to the load port portion-51 side and supports the opener 3 at the conveying chamber-52 side by the door arm 42 and frame arms 12a and 12b through a long hole 57 formed on a compartment 55.

The long hole 57 is set by using the moving direction of the movable portion 56, that is, the vertical direction in the case of this embodiment as a longitudinal direction. Moreover, the load port portion 51 is comparted from the conveying chamber 52 by a cover 58 so that the cleaning degree in the conveying chamber 52 is not degraded by the long hole 57. Moreover, a limiter 59 for preventing overrun when the opener 35 lowers is set below the compartment 55. The rod-less cylinder 33 and guides 61a and 61b are set to the compartment 55 along the long hole 57. The movable portion 56 is vertically moved by the rod-less cylinder 33 along the guides 61a and 61b. A sensor dog 7 is set at the side of the movable portion 56 along the rod-less cylinder 33.

The sensor dog 7 is a plate extending in the direction along the rod-less cylinder 33 and has index means arranged at constant intervals in its longitudinal direction. This embodiment has a concavo-convex portion 12 serving as cutouts arranged at constant intervals as index means. Then, the number of concaves and convexes corresponds to the number of stages of a wafer arrangement shelf in a pod and moreover, concaves and convexes are arranged so that they always correspond to one cutout when coming to an optional shelf having a movable portion. A transmission sensor 8 serving as a second transmission sensor is fixed on the horizontal compartment 55 at the sensor dog-7 side of the movable portion 56.

The sensor portion of the transmission sensor 8 is set so as to hold the concavo-convex portion 12 having cutouts at constant intervals set to the sensor dog 7. The concavo-convex portion 12 of the sensor dog 7 can be detected in accordance with movement of the movable portion 56. A third transmission sensor 62 is set to the support member 60 of the movable portion 56 and a limiter 64 is set to the compartment 55 nearby the lower end of the long hole 57. In the case of the present mechanism, when a protruded portion light-shields the limiter 64 a stop signal is output to the movable portion 56 and the whole operation of the opener 3 stops.

Figure 5:
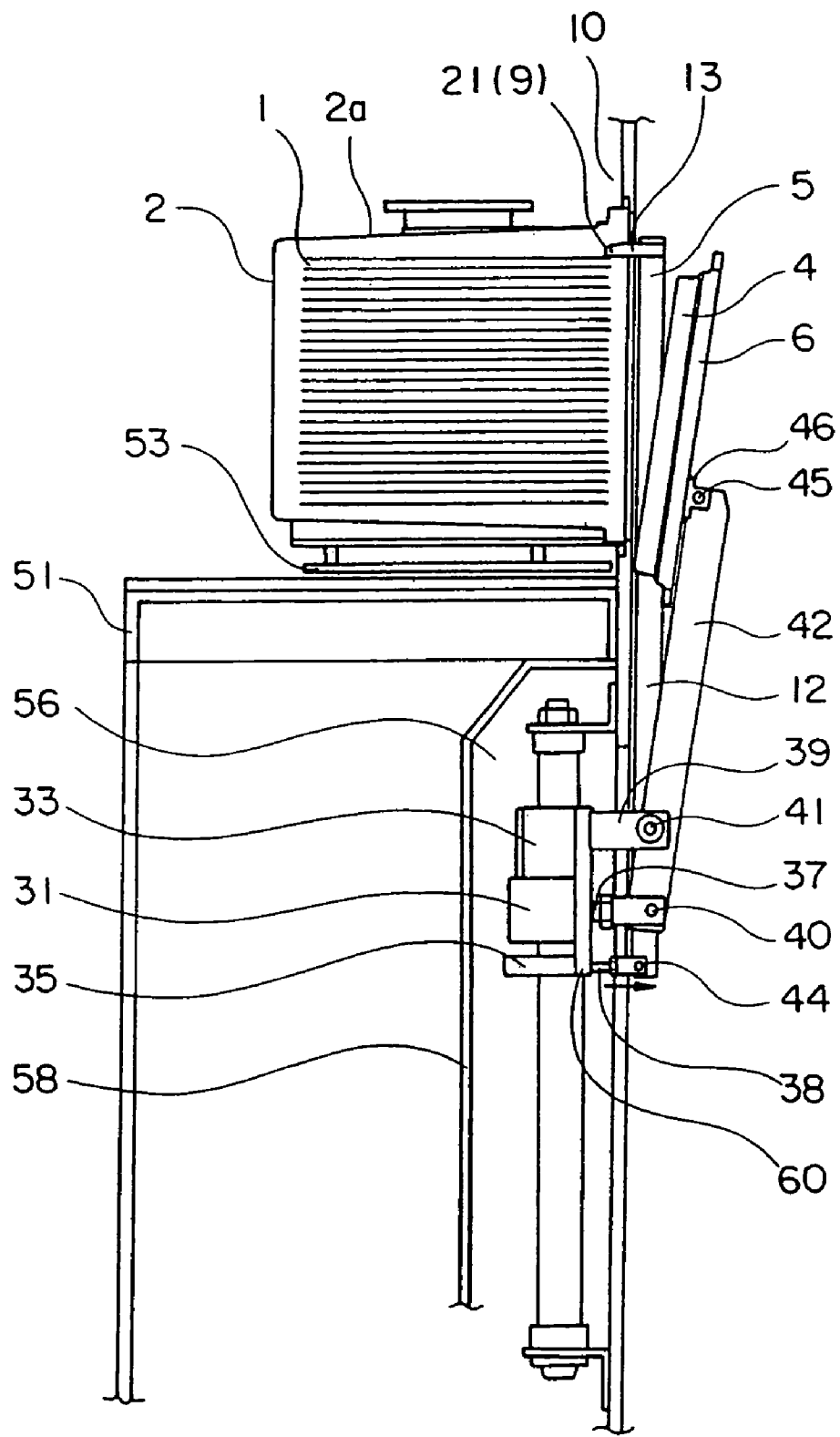
FIG. 5 is an illustration showing a schematic configuration when viewing an opener and the like showing a mapping sequence of a wafer from a side and showing a state when the mapping preparation is completed.
Figure 6:
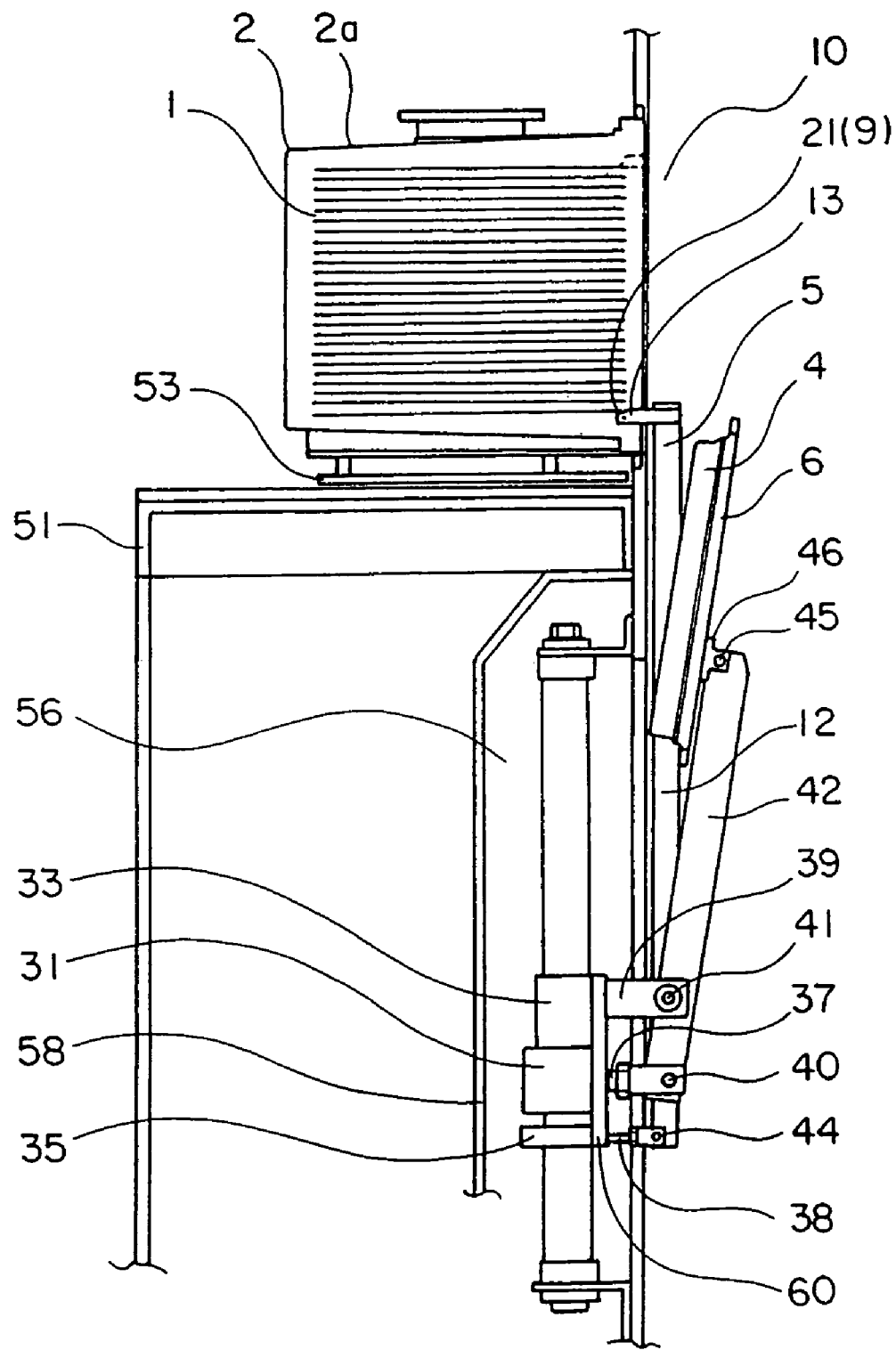
FIG. 6 is an illustration sowing a schematic configuration when viewing an opener and the like showing a mapping sequence of a wafer from a side and showing a state in which the mapping operation is completed.
Figure 7:
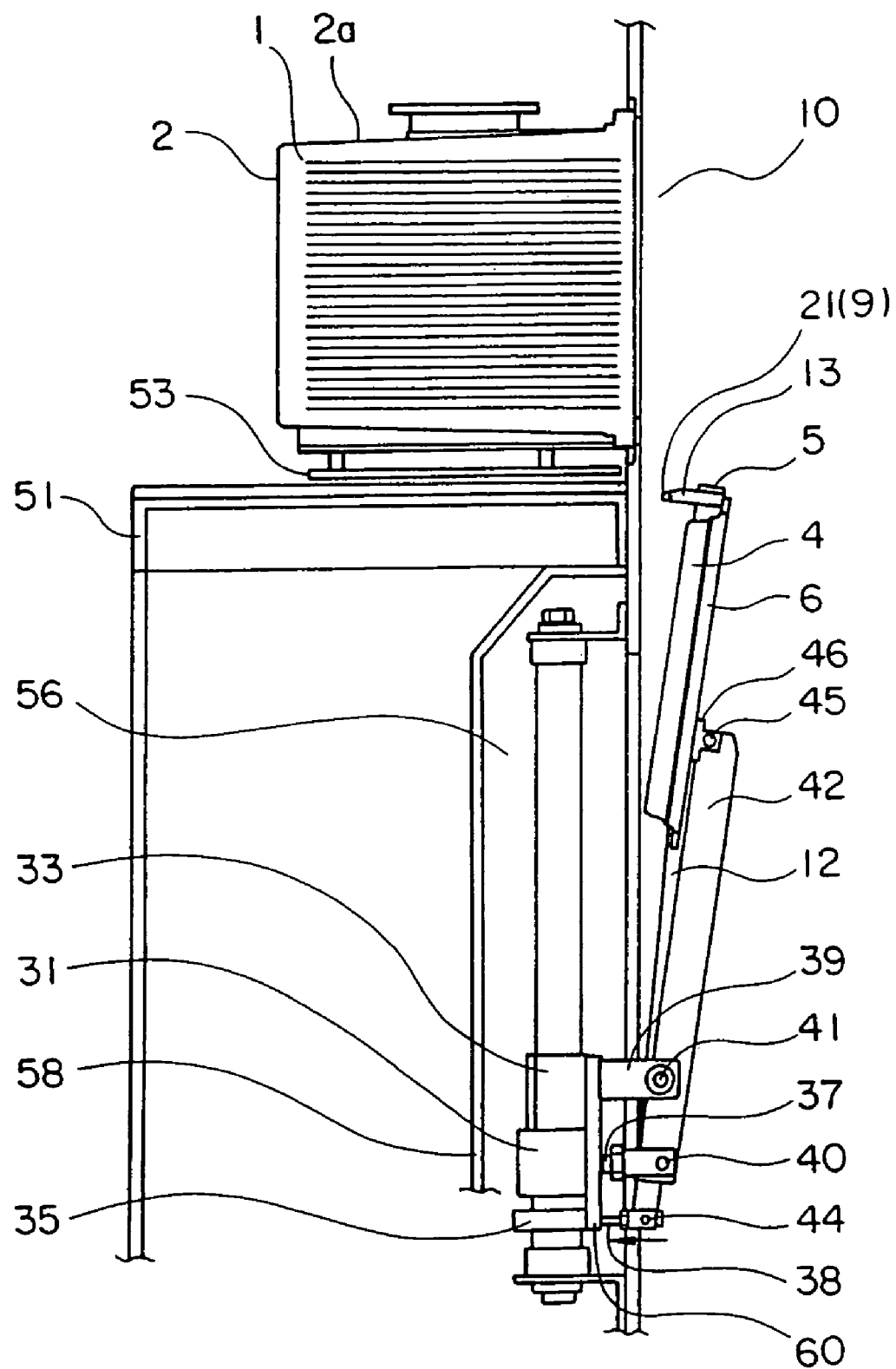
FIG. 7 is an illustration showing a schematic configuration when viewing an opener and the like showing a mapping sequence of a wafer from a side and showing a state in which mapping and the opening operation of a lid are all completed.

Then, based on these configurations, how the contaminant removal operation on the wafer 1 and the mapping operation are performed is described by referring to FIGS. 3A and 3B to FIG. 7. FIG. 3A is an illustration showing a standby state, FIG. 5 is an illustration showing a state in which the frame 5 is operated by opening/closing the lid 4, FIG. 6 is an illustration showing a state in which the contaminant removal operation of the wafer 1 and the mapping operation are completed, and FIG. 7 is an illustration showing a state in which the frame 5 returns to a standby state after an operation applied to the wafer 1 is completed. Moreover, FIGS. 4A and 4B show a front view and a side view on a sensor dog set to detect the driving position of the frame 5 and relevant configuration.

The wafer 1 satisfying the treatment standard of the pretreatment is housed on a shelf in the pod 2 completing the pretreatment step while the wafer 1 not satisfying the standard is excluded from the step at the stage of the pretreatment. A stage on which the wafers 1 is present and a stage on which the wafer 1 is not present are mixed in stages of the shelf in the pod 2. The pod 2 under the above state is mounted on the pedestal 53 on the conveying chamber 52 as shown in FIG. 3A and moves so as to approach to the conveying-chamber opening 10. Under the above state, the opener 3 is kept in a standby state. That is, the rod 37 of the door opening/closing cylinder 31 is most extended and the door arm 42 is kept in a state in which the door arm 42 presses the door 6 against the conveying-chamber opening 10 centering around the fulcrum 41 to close it.

In the case of this embodiment, under the above state, the arm 42 is kept in a state of vertically standing. However, the rod 38 of the frame driving cylinder 35 is most contracted and the frame arms 12a and 12b are kept in a state of the act so as to dissociate the frame 5 from the wall surface of the conveying chamber 52 about the fulcrum 41. That is, in the case of this embodiment, the frame arms 12a and 12b are diagonally kept by having a certain angle from the door arm 42.

FIG. 5 shows a state in which the pod 2 approaches the conveying-chamber opening 10 and the door 6 hold the lid 4. When the pod 2 approaches the conveying-chamber opening 10, the lid 4 of the pod 2 adheres to the door 6 and holds the lid 4 of the pod 2 through the holding portions 11a and 11b by means of vacuum attraction. When the door 6 holds the lid 4, the door opening/closing cylinder 31 acts to contract the rod 37. Then, the pivot 40 set to an end of the door arm 42 is attracted to the support base-60 side and the door arm 42 rotates so as to dissociate the door 6 from the mini-environment opening 10 by the fulcrum 41 in accordance with the principle of lever to release the lid 4 from the pod 2.

After the lid 4 is released, the upper end of the frame 5 enters the position of the opening 10 and the movable portion 56 slightly lowers down to a position where the frame arms 12a and 12b can rotate. After the movable portion 56 lowers, the frame arm 12 actually starts its rotation. That is, the rod 38 of the frame driving cylinder 35 extends and the frame arms 12a and 12b rotate until the frame 5 almost contacts with the circumference of the conveying-chamber opening 10. Then, the gas supply nozzles 21a and 21b and the transmission sensors 9a and 9b set to the upper portion of the frame 5 exit to the outside from the conveying-chamber opening 10 and is inserted into the pod 2. At this point of time, the gas supply nozzles 21a and 21b are arranged as shown in FIG. 2. Moreover, the first transmission sensors 9a and 9b arranged in parallel with the gas supply nozzles 21a and 21b are arranged so that the wafer 1 is present on the straight line connecting the sensors 9a and 9b to constitute a detection space.

Under the above state, the movable portion 56 vertically moves and at the same time, the removal operation of contaminant from individual wafer 1 by spraying high clean gas and the mapping operation of the wafer 1 are sequentially executed. That is, the opener 3 is lowered down to the position shown in FIG. 6 by the rod-less cylinder 33. The transmission sensors 9a and 9b vertically lower to the face of the wafer 1 together with the movable portion 56 and opener 3. When the wafer 1 is present on a stage of the shelf, the wafer 1 intercepts the light emitted from the transmission sensor 9a. However, when the wafer 1 is missing from a stage of the shelf, the light for the transmission sensor 9a is not intercepted. Each sensor is set so that when the transmission sensor 9b is intercepted by the wafer 1, the sensor 9b outputs a non-transmission signal and when the transmission sensor 9b is not intercepted by the wafer 1, the sensor 9b outputs a transmission signal.

Thereby, it is possible to determine that the wafer 1 is present when the non-transmission signal is detected and determine that the wafer 1 is missing when the transmission signal is detected. By spraying high clean gas on the wafer 1 at a predetermined pressure for a predetermined time by the gas supply nozzles 21a and 21b in response to this transmission signal, it is possible to effectively remove contaminant or the like from each wafer. In this case, it is allowed to stop spraying of high clean gas in accordance with a non-transmission signal by considering the gas use efficiency. However, it is also allowed to change gas spraying conditions by considering the change of the gas flow rates on a wafer to be operated because intervals between wafers are different.

The sensor portion of the transmission sensor 8 is set so as to hold the concavo-convex portion 12 having cutouts at constant intervals set to the sensor dog 7. Therefore, when the movable portion 56 lowers, the transmission sensor 8 also lowers to detect the concavo-convex portion 12 of the sensor dog 7. In this case, when the transmission sensor 8 passes through a concave portion, it outputs a transmission signal without being light-shielded and when the sensor 8 passes through a convex portion, the transmission sensor 8 is light-shielded to output a non-transmission signal. Therefore, by previously setting the concavo-convex portion 12 of the sensor dog 7 so that the point of time at which transmission sensors 9a and 9b pass through each stage of a shelf in the pod 2 corresponds to the point of time at which the transmission sensor 8 passes through a concave portion, transmission or non-transmission signal detected by the transmission sensor 8 shows a signal on a stage of a shelf through which the transmission sensor 9 actually passes.

When the transmission sensor 9a is light-shielded and the transmission sensor 8 detects a signal corresponding to a stage of a shelf by comparing the above signal with a detection result of a transmission or non-transmission signal detected as a result of the fact that the transmission sensor 9a performs light-shielding on the wafer 1, it can be determined that the wafer 1 is present on the shelf stage. However, when the transmission sensor 9a is not light-shielded at that time, it can be determined that the wafer 1 is missing on the stage. By changing high-clean-gas spraying timings or spraying conditions in accordance with the above determination, it is possible to more effectively perform the removal operation of contaminant or the like. When the above operation is repeated for every wafer 1 and a support rod reaches the mapping completion position of the opener 3, the contaminant removal operation and mapping operation are completed.

Thereafter, by contracting the rod 38 of the frame opening/closing cylinder 35 again, the frame arms 12a and 12b rotate and the frame 5 moves so as to get away from the conveying-chamber opening 10. When the rod 38 is most contracted, movement of the frame 5 is completed. Then, the movable portion 56 moves down to the lowest point and completes a series of operations for removing contaminant or the like and performing mapping for the wafer 1 together with release of the lid 4. FIG. 7 shows the above state.

As described above, in the case of this embodiment, the gas supply nozzles 21a and 21b and the transmission sensors 9a and 9b are fixed to the same frame 5. Moreover, the frame arms 12a and 12b serving as means for rotating the frame 5 and frame driving cylinder are used. Because of setting these configurations to the movable portion 56 sufficiently separate from the conveying-chamber opening 10, it is unnecessary to set an apparatus for developing a gas supply nozzle and transmission sensor nearby the wafer 1. Moreover, by using the sensor dog 7 and transmission sensor 8, it is possible to easily generate a sync signal corresponding to a stage of a shelf in the pod 2. Therefore, it is possible to more effectively remove contaminant or the like simultaneously with the mapping operation of the wafer 1 without using a driving motor for a drive. Thus, by using the sensor dog 7, it is possible to use a pneumatic cylinder not capable of generating a signal for mapping of the wafer 1.

Moreover, in the case of this embodiment, the fulcrum of the door arm 42 and that of the mapping frame 5 are commonized by the fulcrum 41. However, even if the both fulcrums are brought to separate fulcrums, the same advantage can be obtained. That is, even if a first fulcrum to be set on the door arm 42 is different from a second fulcrum to be set on the mapping frame, the same advantage can be obtained. Though the movable portion 56, fulcrum 41, door opening/closing cylinder 31, and mapping-frame driving cylinder 35 are integrated, it is not always necessary to integrate them in order to obtain an advantage of the present invention. As long as these configurations are set to the downstream side of an air flow for the pod 2, the same advantage can be obtained.

In the case of this embodiment, a gas supply nozzle is fixed on a support rod in parallel with a wafer mapping sensor in order to apply the present invention without greatly changing a configuration according to the standard of a FOUP. However, the present invention is not restricted to the above case. Specifically, it is also allowed to fix the gas supply nozzle onto a frame different from the sensor. Moreover, it is allowed to add a driving mechanism to the gas supply nozzle so that the gas supply nozzle is movable in parallel with a wafer face or rotatable. By using the above configuration, it is possible to entirely purse the surface of a wafer even if the number of nozzles is small. Furthermore, it is considered that an attached state of contaminant or the like fluctuates in accordance with a processing performed just before. In this case, it is allowed to change the number of gas supply nozzles in view of the attached state or gas consuming state.

Moreover, in the case of this embodiment, the removal operation of contaminant or the like is performed only once in accordance with the mapping operation. However, the present invention is not restricted to the above case. It is possible to always perform the removal operation other than the case in which a robot arm in a conveying chamber accesses a wafer in a pod. Therefore, while various treatments are applied to a wafer in the treating apparatus, it is also allowed to repeatedly apply the removal operation to a wafer held in the pod.

Furthermore, though this embodiment describes a FOUP as an object, an applied example of the present invention is not restricted to the system. As long as a system is used which has a container for housing a plurality of objects to be held and a conveying chamber for conveying the objects to be held by the container to an apparatus for treating the objects to be held, it is possible to applying a removing apparatus (purging apparatus) of contaminant or the like of the present invention.

SECOND EMBODIMENT

Figure 8A:
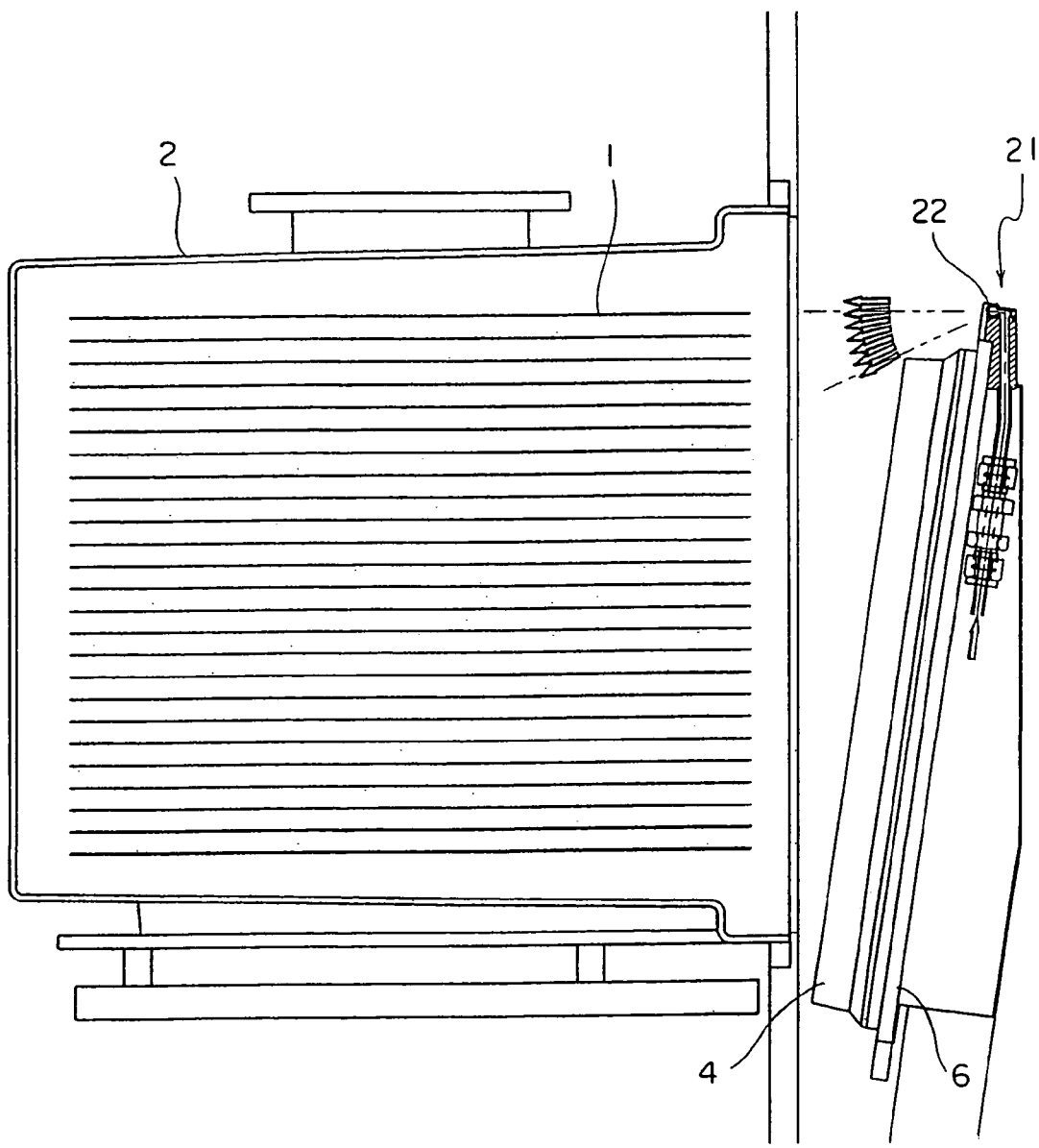
FIG. 8A is an illustration showing a schematic configuration when viewing a purging apparatus of second embodiment of the present invention, a pod, a lid for the pod, and a part of an opener from a side.
Figure 8B:
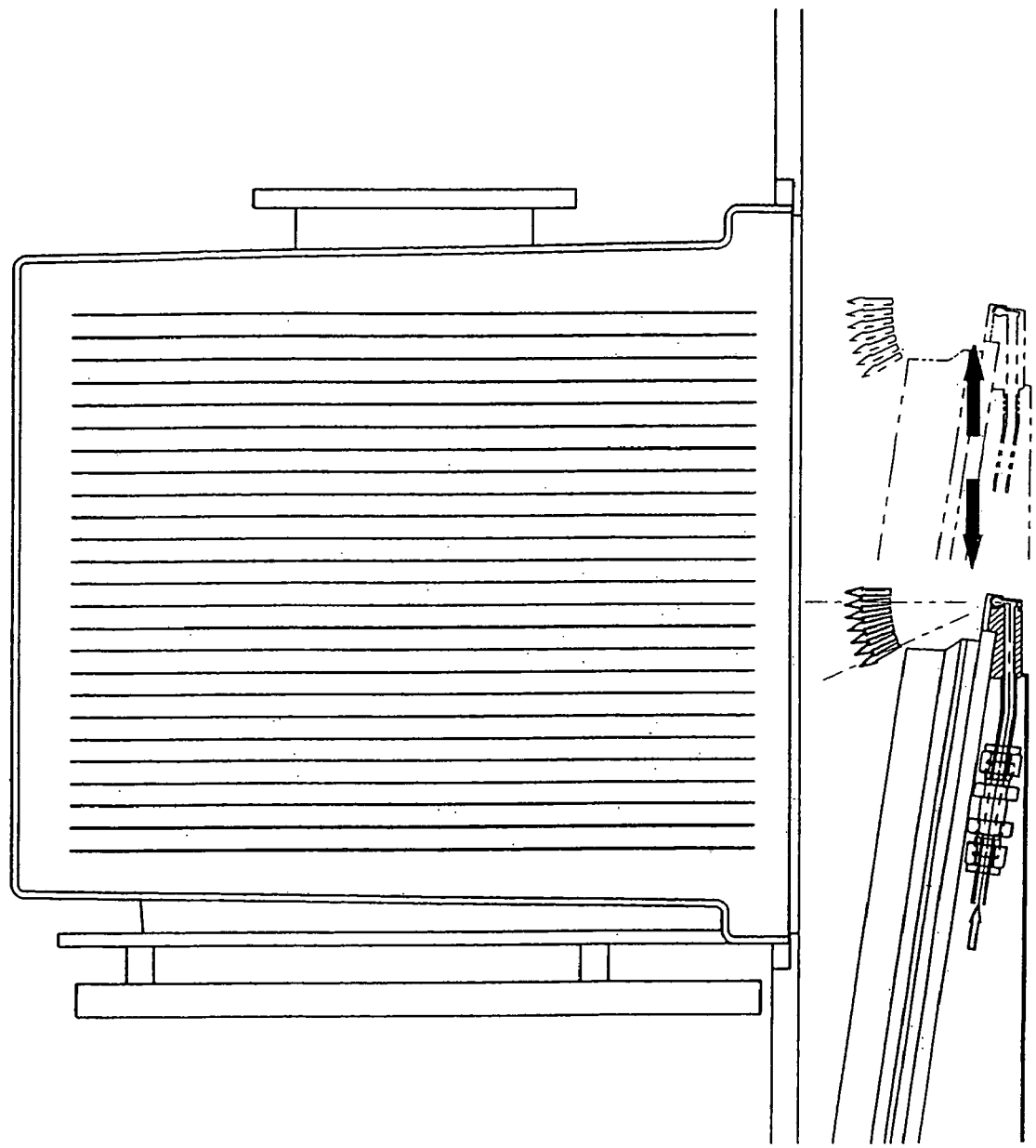
FIG. 8B is a schematic configuration when viewing the purging apparatus of the second embodiment of the present invention, a pod, a the lid for the pod, and a part of an opener from a side.
Figure 8C:
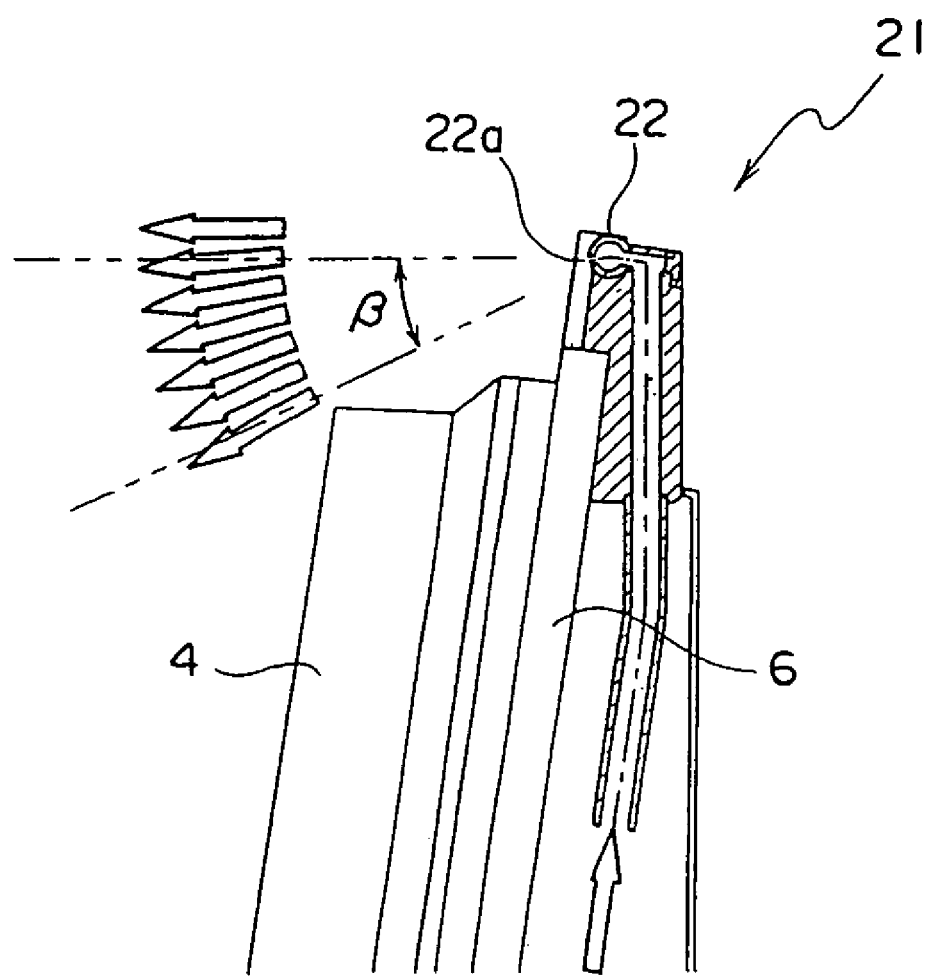
FIG. 8C is an illustration showing a schematic configuration of an essential portion of the purging apparatus of the second embodiment of the present invention, viewed from a side.
Figure 9A:
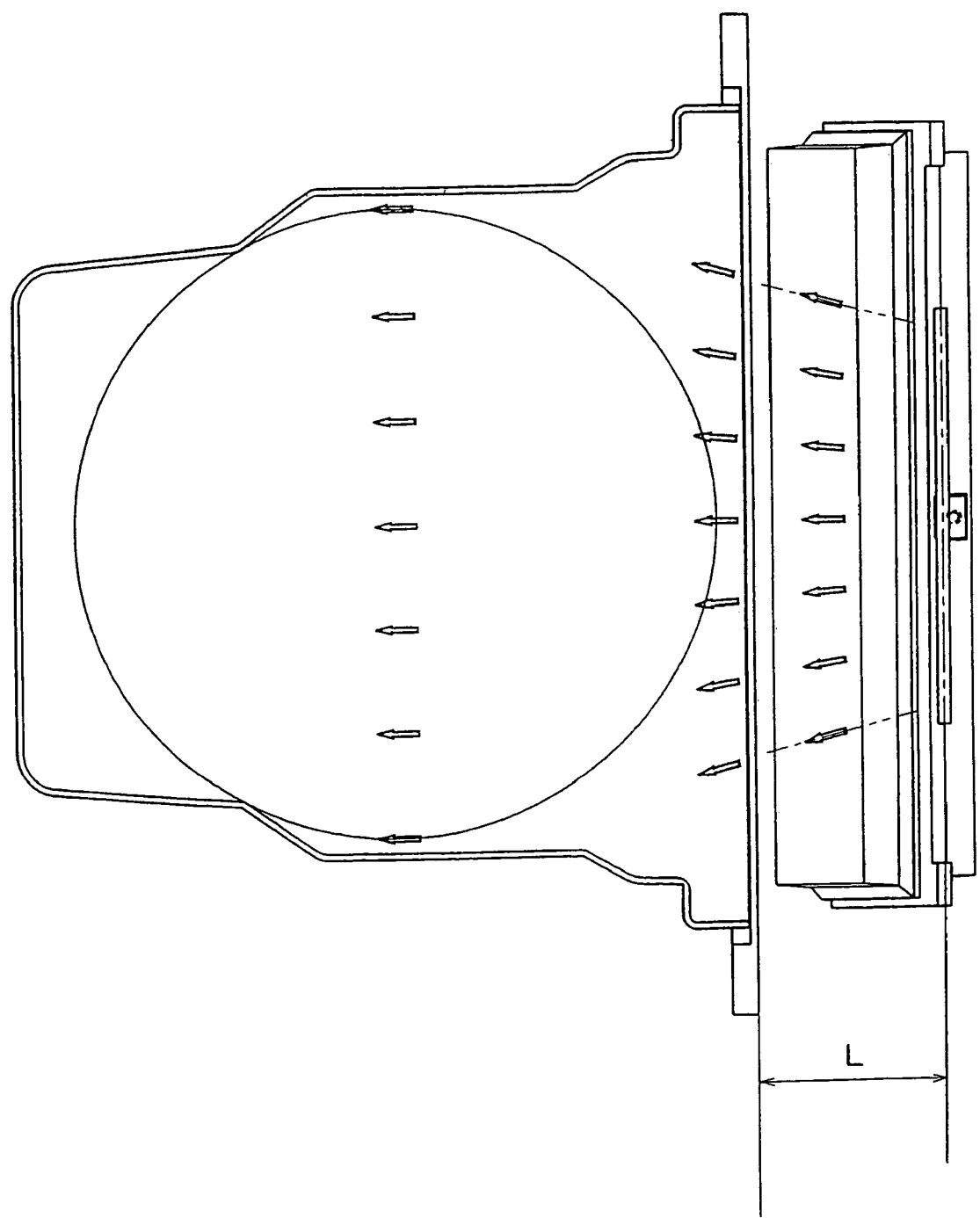
FIG. 9A is an illustration showing a schematic configuration when viewing the purging apparatus of the second embodiment of the present invention and a configuration set at the periphery from above.
Figure 9B:
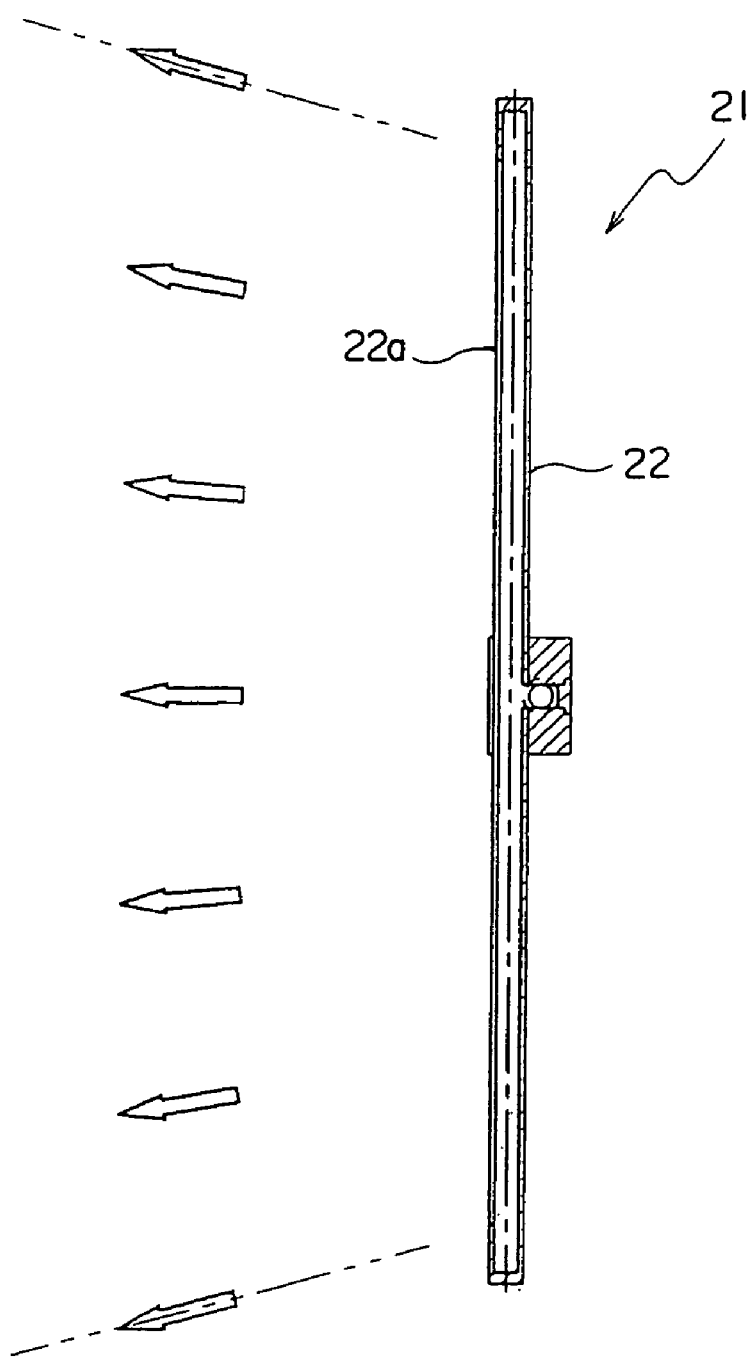
FIG. 9B is an illustration showing a schematic configuration when horizontally cutting an essential portion of the purging apparatus of the second embodiment of the present invention and viewing the cross section from above.

Second embodiment of the present invention is described below by referring to the accompanying drawings. FIGS. 8A to 8C are illustrations relating to a schematic configuration of a purging apparatus of the present invention, which are illustrations showing the outline of a state when viewing a pod, a wafer housing in the pod, and the purging apparatus of the present invention from a side. FIG. 8A shows the time of starting the purging operation, FIG. 8B shows the middle of the purging operation, and FIG. 8C shows an enlarged view of an essential portion of the purging apparatus. Moreover, FIG. 9A is an illustration showing an essential portion when viewing the configurations shown in FIGS. 8A to 8C and a configuration following the configurations from their upper potion and FIG. 9B is an illustration when cutting an essential portion of the purging apparatus by a horizontal face and viewing the essential portion from the upper portion. A shelf for supporting a wafer, sealing member set between a lid and a pod, and various configurations are originally included in the pod and various configurations are attached to a door. However, because these configurations do not have a direct relation with the present invention, detailed illustrations and descriptions of them are omitted.

In FIGS. 9A and 9B, a gas supply nozzle 21 capable of discharging clean gas in the direction shown by an arrow is set to the upper portion of a door 6 of an opener. A not-illustrated gas supply line is connected to the gas supply nozzle 21 so that clean gas can be supplied to the nozzle in accordance with an operation from the outside. As shown in FIG. 9B, the gas supply nozzle 21 is constituted of an almost-tubular member 22 extending in the direction parallel with the surface of a wafer 1 and the tubular member 22 has an opening 22a linearly formed in parallel with the surface of the wafer 1.

Clean gas is introduced into the tubular member from a portion not facing the opening 22a at almost the central portion of the tubular member 22. By successively moving the gas supply nozzle 21 in the direction in which the wafers 1 are superimpose to supply clean gas to each wafer. As a result, the removal operation of contaminant or the like on the surface and back of a wafer and inside of the pod 2 by clean gas, the so-called purging operation is performed. The door 6 is driven in parallel with the direction in which the wafers 1 are superimposed. Therefore, by discharging clean gas from the gas supply nozzle 21 when driving the door 6, the purging operation can be successively applied to the wafers 1 in the pod 2.

In the case of this embodiment, the center of the tubular member 22 in the gas supply nozzle 21 is separated from the opening end of the pod body 2 by a predetermined interval. The opening 22a has a shape in which the clean gas discharged from the opening 22a is diffused in the horizontal direction as shown in FIG. 9B and diffused in the vertical direction as shown in FIGS. 8A to 8C. By setting an interval L between the tubular member 22 and the opening of the pod body 2, clean gas is sprayed on the whole surface of the wafer 1 in the horizontal direction to remove contaminant or the like. Moreover, the flow rate of gas normally discharged from a gas supply nozzle is fastest nearby the opening of the nozzle but it quickly lowers as getting away from the opening. Therefore, when supplying gas from a position too close to a wafer end, a large flow rate difference occurs between the upstream side and the downstream side of the gas flow on the surface of a wafer and a large difference may occur between removal efficiencies of contaminant or the like or the removal efficiency of contaminant or the like may be lowered due to an eddy flow generated when an extremely fast gas flow collides with a wafer end. That is, by setting the interval L, it is possible to reduce these possibilities and easily form a gas flow flowing on the surface of a wafer at an almost uniform speed and uniformly and efficiently remove contaminant from the surface and back areas of a wafer. Moreover, by using a configuration in which clean gas is discharged to an area turned downward by an angle P from the horizontal direction in the vertical direction, new clean gas contacts with the surface and back of a wafer at an angle of a certain degree and it is possible to more efficiently remove contaminant or the like. It is preferable that the interval L and angle $\beta$ are properly adjusted so that contaminant on the wafer 1 is more efficiently removed and it can be discharged from the inside of the pod 2 in accordance with the size of and interval of wafers held in the pod 2, and shape of the pod 2. Moreover, from the same reason, it is allowed to use a configuration for changing the width, length, opening angle, or number of openings 22a by the example concerned or a configuration capable of changing directions of the opening 22a.

In the case of the present invention, it is possible to remove contaminant or the like from every wafer or the whole area of surface and back of a wafer. Therefore, it is possible to hold wafers in a pod at a higher cleaning degree than ever. Moreover, in the case of the present invention, it is possible to control a gas flow rate and purging time required for the removal operation of contaminant or the like for each wafer. Therefore, it is also possible to perform the removal operation always under a constant condition and easily keep the control state of every wafer in a pod constant.

It is also allowed to discharge gas or the like supplied into the pod 2 from the gas supply nozzle 21 by using an exhaust port which is conventionally set to the pod 2. Moreover, because the purging operation is performed in a state in which the lid 4 is opened, it is also allowed to perform the purging operation by using a not-illustrated exhaust system set in the conveying chamber. Furthermore, it is considered that it is preferable to prevent the contaminant or the like once removed from reattaching to other wafer or inside of the pod or flowing into the conveying chamber. In this case, as disclosed in the above Japanese Patent Application Laid-Open No. 2003-45933, it is allowed to set a small chamber dedicated to exhaust communicating with the opening of a pod in a conveying chamber in order to efficiently exhaust the clean gas used for the removal operation of contaminant or the like.

As described above, it is preferable that contaminant or the like once removed from a wafer is quickly conveyed to the outside of a pod. Therefore, to more efficiently remove contaminant, it is also considered to add an exhaust port corresponding to each wafer as shown in the above Japanese Patent Application Laid-Open No. 11-251422. However, addition of this configuration requires a great standard change of a pod corresponding to a standard. Therefore, when using the present invention for a system relating to a presently-used FOUP, it is considered that it is preferable not to use the above exhaust port.

Moreover, a case is considered in which contaminant or the like is attached to wafer in the form of dust. It is considered that this dust is electrified and frequently attached to a wafer due to electrostatic attracting force. It is possible to efficiently remove the above dust not by spraying high clean gas on a wafer but by spraying ionized gas on the wafer. Therefore, it is more preferable to use a configuration capable of supplying ionized gas according to necessity by adding the so-called ionizer for ionizing gas to a gas supply nozzle or a portion nearby the nozzle.

(One Example to which this Embodiment is Applied)

Then, a case in which a purging apparatus of the present invention is applied to a system relating to a FOUP currently used is described below by referring to the accompanying drawings. Because the schematic configuration of a semiconductor wafer treating apparatus to which the present invention is applied and a pod is almost the same as the configuration described for the prior art, description of the same configuration is omitted. It is also allowed to support and drive the above-described gas supply nozzle 21 by a member independent of the above described door 6. However, in the case of this applied example, the present invention is more easily executed by setting a gas supply nozzle or the like of the present invention to the upper portion of the door 6.

In the case of a schematic configuration of the wafer treating apparatus 50, the conveying-chamber opening 10 slightly larger than the lid 4 of the pod 2 is set to the load port portion-51 side in the conveying chamber 52. The opener 3 for opening/closing the lid 4 of the pod 2 is set to the conveying-chamber opening-10 side in the conveying chamber 52. In this case, the opener 3 to which the present invention is applied is described by referring to FIGS. 10A and 10B. FIG. 10A is an illustration showing the whole apparatus by contracting the load port portion 51, pod 2, opener 3, and lid 4 in FIG. 1 and FIG. 10B is an illustration when viewing the configuration shown in FIG. 10A from the inside of the conveying chamber 52.

The opener 3 has the door 6 and frame 5. The door 6 is a plate having a size capable of closing the conveying-chamber opening 10 and holding portions 11a and 11b serving as vacuum inlet ports are set to the face of the door 6. When the door 6 closes the conveying-chamber opening 10, the face located at the pod-2 side is a plane so that it is able to closely contact with the lid 4. A fixed member 46 having a hole is set to the door 6. A pivot 45 set to the upper end of the door arm 42 is fixed by rotatably passing through the hole. A hole is formed at the lower end of the door arm 42. A pivot 40 passes through the hole and a hole at the front end of the rod 37 serving as a part of the pneumatic door opening/closing cylinder 31 which is a door opening/closing drive. Thereby, the door arm 42 is connected with the cylinder 31 and rotatably supported by the cylinder 31.

The frame 5 is a structure constituted of a frame member set along the conveying-chamber opening 10 so as to surround the door 6. The frame 5 is set to the upper ends of the frame arms 12a and 12b extending long on the frame member below the frame 5. A not-illustrated hole is formed at the lower ends of the frame arms 12a and 12b. The pivot 44 passes through the above hole and a hole at the front end of the rod 38 serving as, a part of the pneumatic frame driving cylinder 35 which is a frame drive. Thereby, the frame arms and cylinder 35 are connected and the frame arms are rotatably supported by the cylinder 35.

The frame arms 12a and 12b extend toward the vertical direction symmetrically and in parallel along the central axis of the frame 5 in order to uniformly support a load. The rod 47 vertical to the frame arms 12a and 12b is set between the upper ends and lower ends of the frame arms 12a and 12b. The fixed member 39 serving as a fulcrum support portion having a shape vertically extended from the support member 60 is set to the support member 60. The fixed member 39 has a through-hole parallel with the support member 60. A bearing (not illustrated) is set to the through-hole of the fixed member 39 and the outer ring of the bearing is supported by the inner wall of the through-hole and the inner ring supports the rod 47. Thereby, the rod 47 constitutes the fulcrum 41 while it is included in the through-hole of the fixed member 39.

The fulcrum 41 is constituted as a fulcrum on the same axis serving as the fulcrums of the arm frames 12a and 12b and the fulcrum of the door arm in common. That is, another through-hole is formed between the upper end and the lower end of the door arm 42. The rod 47 passes through the through-hole to constitute the fulcrum 41. The door arm 42 can rotate about the fulcrum 41 in accordance with the telescopic motion of the rod 37 due to driving by the cylinder 31. The fulcrum 41 of the door arm 42 is fixed to the support member 60 set to the movable portion 56.which is vertically movable. The door 6 has holding ports 11a and 11b and is able to hold the lid 4 of the pod 2 through vacuum attraction. The door arm 42 is set so as to be almost vertical when it presses the door 6 against the conveying-chamber opening 10 (hereafter referred to as standby state) and the door 6 moves in a direction getting away from the wall surface of the conveying chamber 52 by rotating the door arm 42.

The frame arms 12a and 12b can rotate about the fulcrum 41 in accordance with the telescopic motion of the rod 38 through driving by the frame driving cylinder 35. That is, the frame arms 12a and 12b are also fixed to the support member 60 set to the movable portion 56 which is able to vertically move. The frame 5 is set so as to diagonally get away from the wall surface of the conveying chamber 52 when the door 6 is kept in a standby state. That is, under the above state, the frame arms 12a and 12b are diagonally supported so as to have a certain angle from the door arm 42 and the upper portion of the frame 5 is separated from the wall surface of the conveying chamber 52 by a certain distance. When the frame 5 rotates the frame arms 12a and 12b in a direction contacting with the wall surface of the conveying chamber 52 from the standby state, the frame 5 almost contacts with the wall surface of the conveying chamber 52.

The support rods 13a and 13b are fixed to a frame member set to the upper portion of the frame 5 so as to be protruded toward the wall surface side of the conveying chamber 52.

The transmission sensors 9a and 9b respectively serving as a first transmission sensor are set to front ends of the support rods 13a and 13b so as to be faced each other.

The movable portion 56 for vertically moving the opener 3 is set to the semiconductor-wafer treating apparatus 50. FIG. 11A is an illustration when viewing the movable portion 56 of the opener 3 from the load port portion-51 side and FIG. 11B is an illustration showing the arrow view X of FIG. 11A. The movable portion 56 includes the pneumatic rod-less cylinder 33 and support member 60 for vertically moving and is set to a portion below the downside of the pod 2 so as to be the downstream side of an air flow of the pod 2. The fixed member 39, pneumatic cylinder 31, and cylinder 35 are set to the support member 60. The movable portion 56 is set to the load port portion-51 side to support the opener 3 at the conveying chamber-52 side by the door arm 42 and frame arms 12a and 12b through the long hole 57 formed on the compartment 55.

The long hole 57 is formed by using the moving direction of the movable portion 56, that is, vertical direction in the case of this example as a longitudinal direction. Moreover, the load port portion 51 and conveying chamber 52 ate comparted by the cover 58 so that the cleaning degree in the conveying chamber 52 is not deteriorated by the long hole 57. Moreover, the limiter 59 for preventing overrun of the opener 3 when the opener 3 lowers is set below the compartment 55. The rod-less cylinder 33 and guides 61a and 61b are set along the long holes 57 in the compartment 55. The movable portion 56 vertically is moved along the guides 61a and 61b by the rod-less cylinder 33. The sensor dog 7 is set along the rod-less cylinder 33 at the side of the movable portion 56.

The sensor dog 7 is a plate extending in the direction along the rod-less cylinder 33 and has index means at certain intervals in its longitudinal direction. This example has the concavo-convex portion 12 serving as cutouts arranged at constant intervals as index means. The number of concaves and convexes corresponds to the number of stages of a wafer arrangement shelf in the pod and moreover, the concaves and convexes are arranged so that one cutout corresponds without fail when the movable portion comes to an optional shelf. The transmission sensor 8 serving as a second transmission sensor is fixed on the horizontal compartment 55 of the movable portion 56 at the sensor dog-7 side.

The sensor portion of the transmission sensor 8 is set so as to hold the concavo-convex portion 12 having cutouts at constant intervals set to the sensor dog 7 and detect the concavo-convex portion 12 of the sensor dog 7 in accordance with movement of the movable portion 56. The third transmission sensor 62 is set to the support member 60 of the movable portion 56 while the limiter 64 is set to the compartment 55 nearby the downside of the long hole 57. In the case of this mechanism, when the protruded portion light-shields the limiter 64, a stop signal is output to the movable portion 56 to stop the whole operation of the opener 3.

Figure 12:
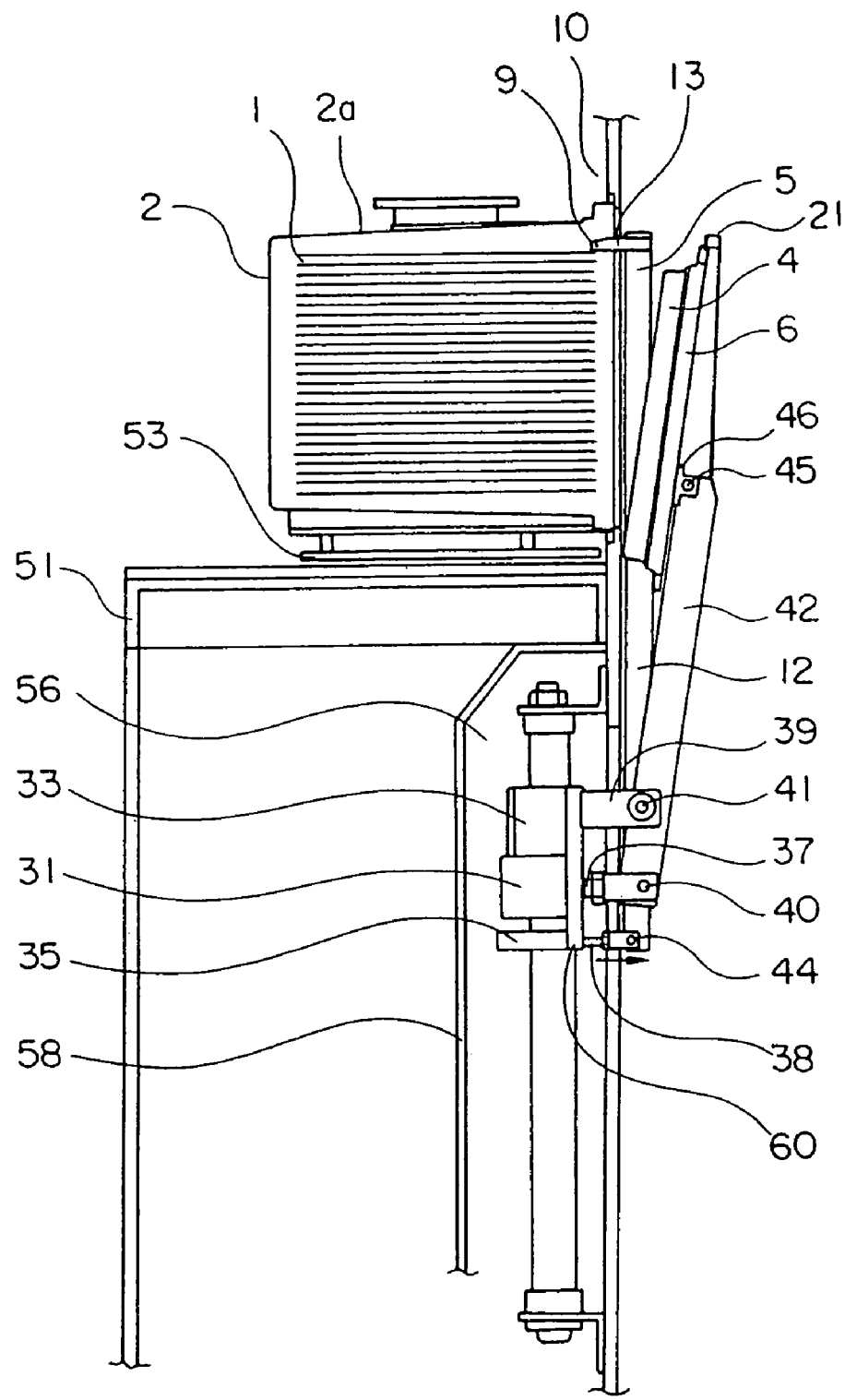
FIG. 12 is an illustration showing a schematic configuration when viewing an opener and the like showing the mapping sequence of a wafer from a side and showing a state in which mapping preparation is completed.
Figure 13:
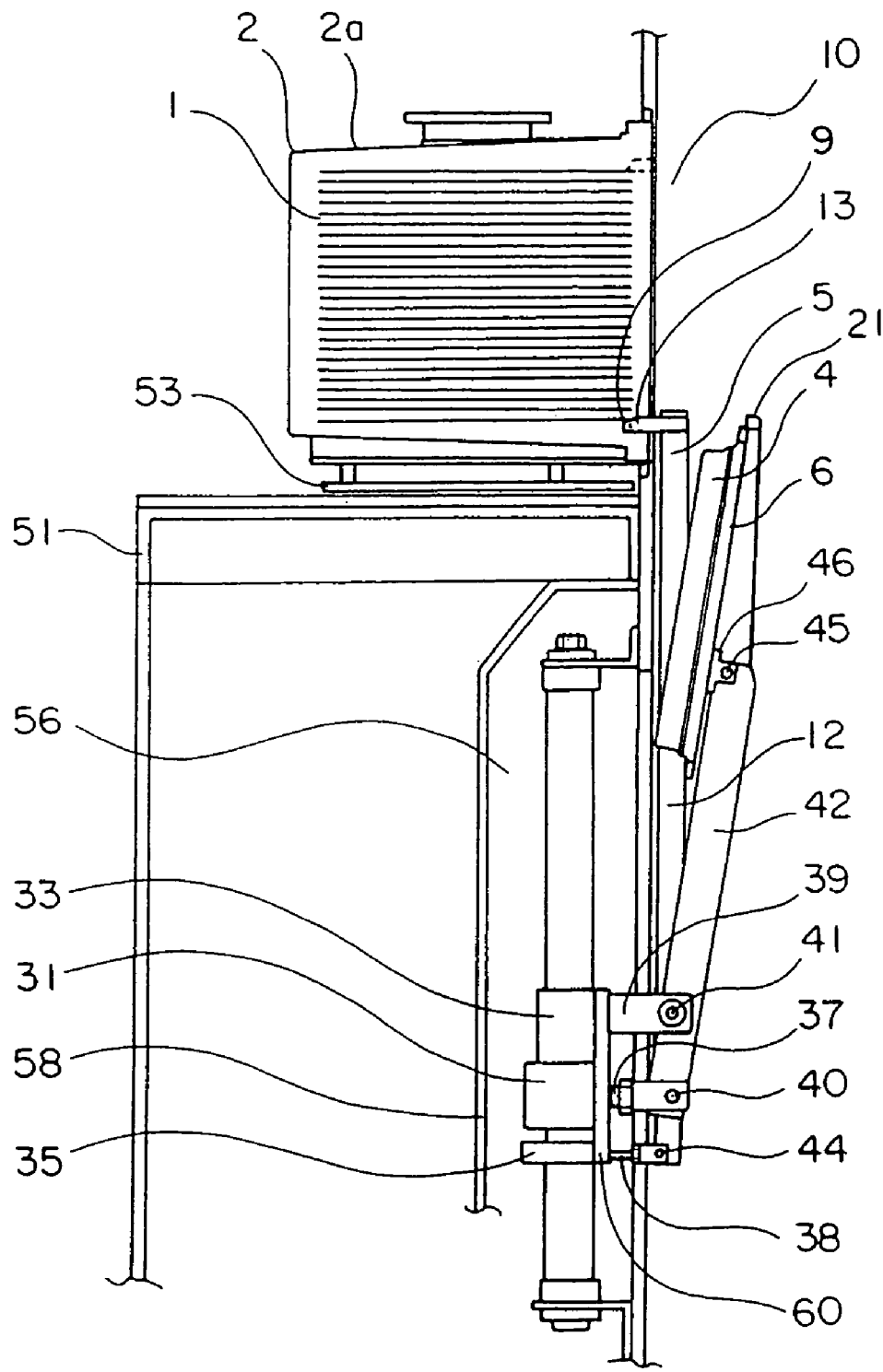
FIG. 13 is an illustration sowing a schematic configuration when viewing an opener and the like showing the mapping sequence of a wafer from a side and showing a state in which the mapping operation is completed.
Figure 14:
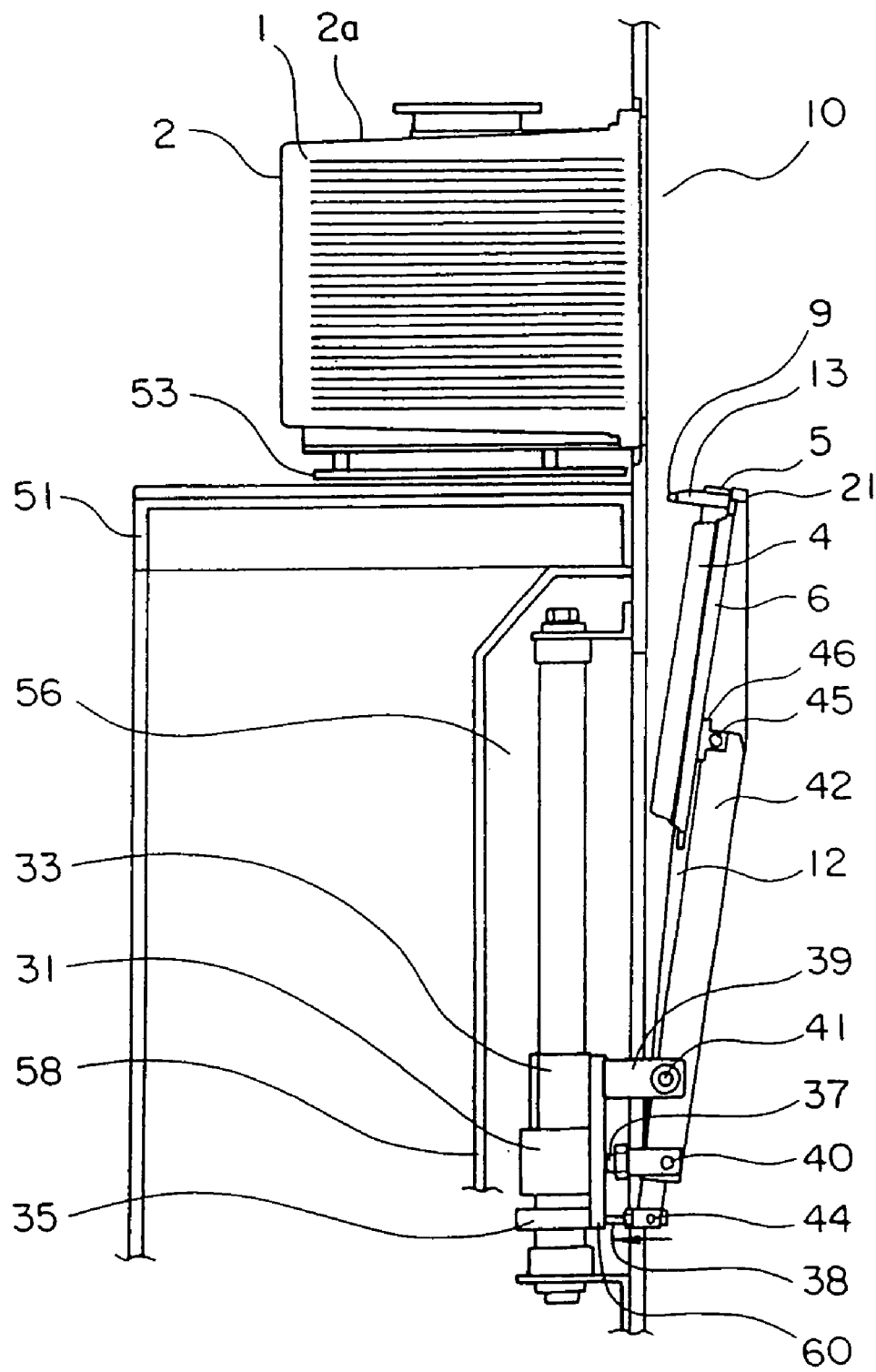
FIG. 14 is an illustration showing a schematic configuration when viewing an opener and the like showing the mapping sequence of a wafer from a side and showing a state in which mapping and the opening operation of a lid are all completed.
Figure 15:
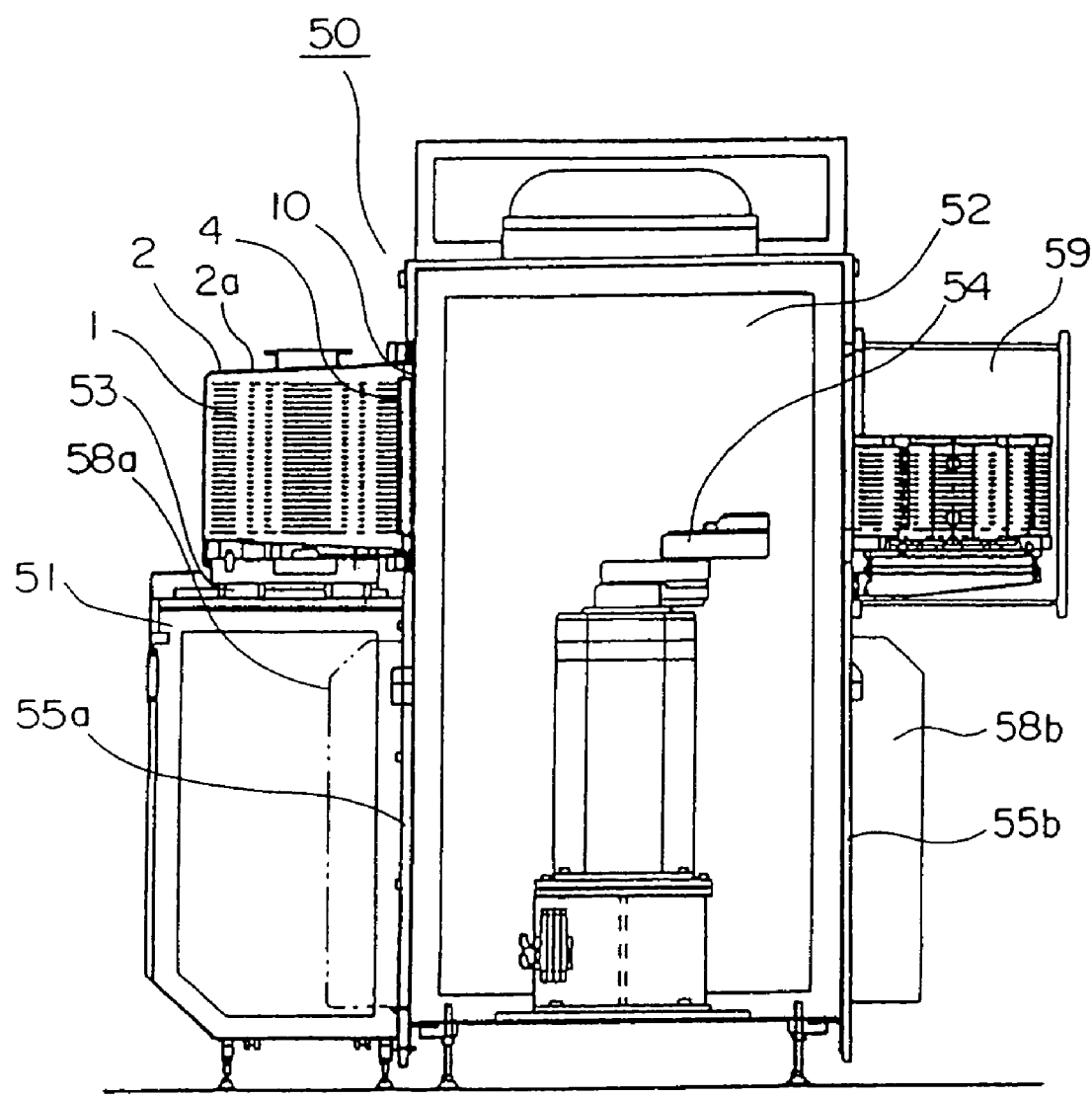
FIG. 15 is a general side view showing a schematic configuration of a wafer treating apparatus to which the present invention and prior art are applied.
Figure 16:
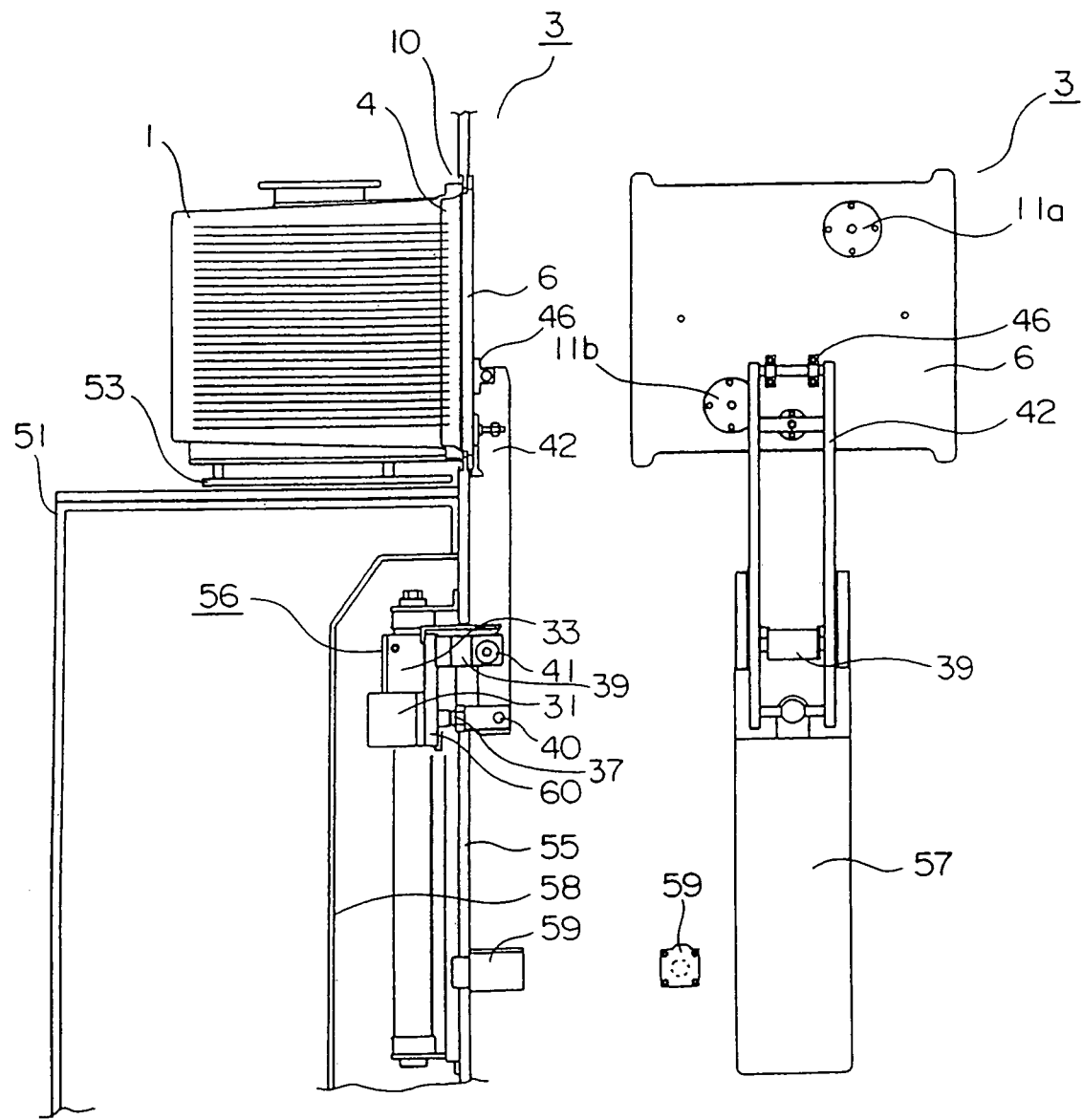
FIG. 16A is an illustration showing a schematic configuration when enlarging a conventional opener of the apparatus shown in FIG. 15 and a configuration nearby the opener and viewing them from a side.
FIG. 16B is an illustration showing a schematic configuration when viewing the configuration shown in FIG. 16A from the conveying chamber side.
Figure 17:
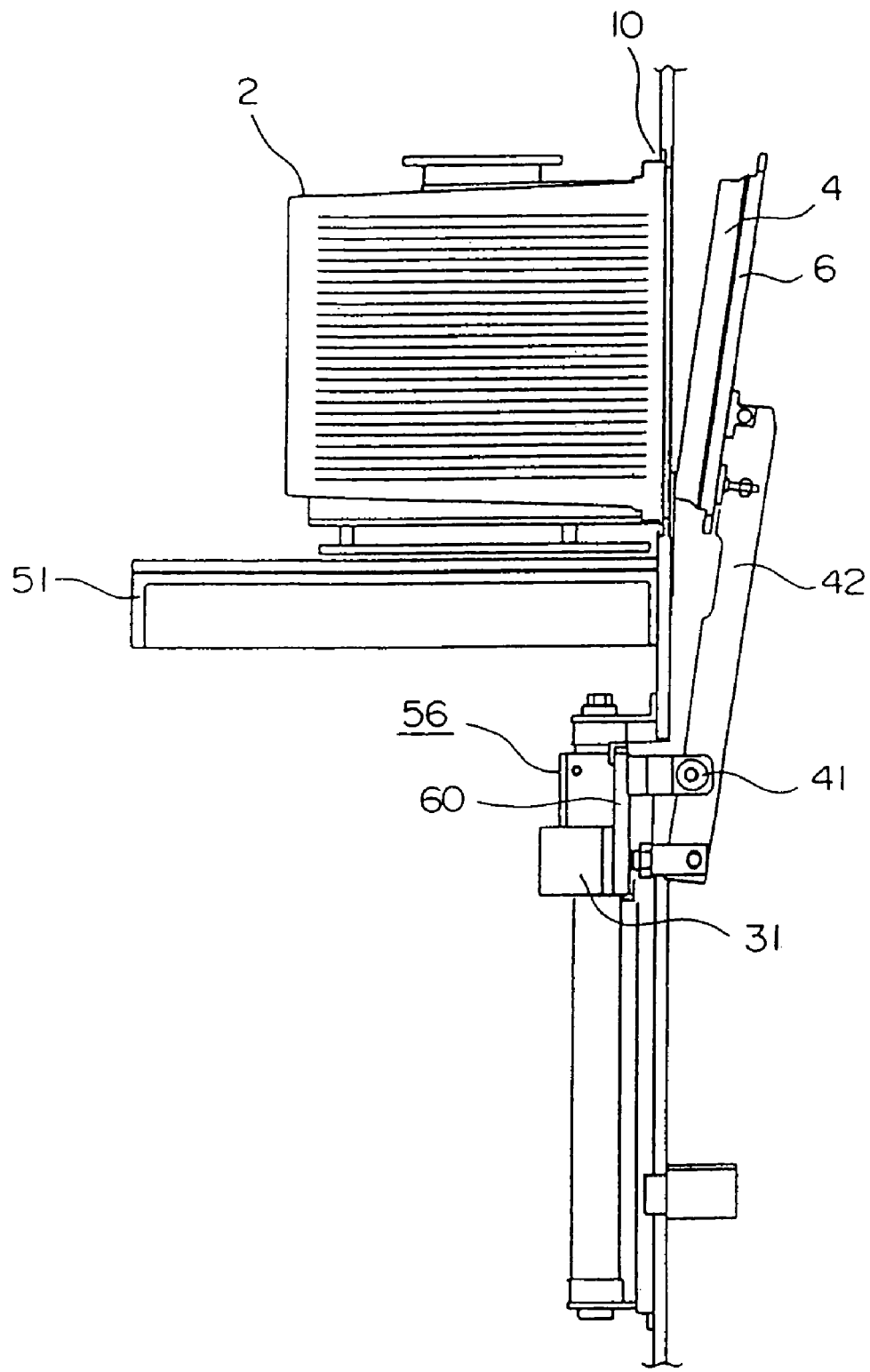
FIG. 17 is an illustration showing a schematic configuration when viewing an opener and the like showing the purging operation of a wafer from a side and showing a state in which purging preparation is completed.

Then, based on these configurations, how the contaminant removal operation and mapping operation on the wafer 1 are performed is described by referring to FIGS. 10A and 10B to FIG. 14. FIG. 10A is an illustration showing a standby state, FIG. 12 is an illustration showing a state in which the frame 5 is operated by opening/closing the lid 4; FIG. 13 is an illustration showing a state in which contaminant removal operation and mapping operation of the wafer 1 are completed, and FIG. 14 is an illustration showing a state in which the frame 5 returns to a standby state after completion of an operation applied to the wafer 1. Moreover, FIGS. 11A and 11B show a front view and a side view of a configuration relating to a sensor dog set to detect the driving position of the frame 5, respectively.

The wafers 1 satisfying the treatment standard for pretreatment are housed in a shelf in the pod 2 completing the previous treatment step while the wafers 1 not satisfying the standard is excluded from the step at the stage of pretreatment. Stages on which the wafers 1 are present and stages on which no wafer 1 is present are mixed in stages of a shelf in the pod 2. The pod 2 under this state is mounted on the pedestal 53 on the conveying chamber 52 as shown in FIG. 10A and moves so as to approach the conveying-chamber opening 10. Under this state, the opener 3 is kept in a standby state. That is, the rod 37 of the door opening/closing cylinder 31 is most extended and the door arm 42 is closed by pressing the door 6 against the conveying-chamber opening 10 centering around the fulcrum 41.

In the case of this example, the arm 42 vertically stands under this state. However, the rod 38 of the frame driving cylinder 35 is most contracted and the frame arms 12a and 12b are kept in a state of acting so as to separate the frame 5 from the wall surface of the conveying chamber 52 centering around the fulcrum 41. That is, in the case of this example, the frame arms 12a and 12b become diagonal at a certain angle from the door arm 42.

FIG. 12 shows a state in which the pod 2 approaches the conveying-chamber opening 10 and the door 6 holds the lid 4. When the pod 2 approaches the conveying-chamber opening 10, the lid 4 of the pod 2 closely contacts with the door 6 to hold the lid 4 of the pod 2 through the holding portions 11a and 11b in accordance with vacuum attraction. When the door 6 holds the lid 4, the door opening/closing cylinder 31 operates to contract the rod 37. Then, the pivot 40 set to an end of the door arm 42 is attracted to the support base-60 side and the door arm 42 rotates by a supporting point 41 so as to dissociate the door 6 from the conveying-chamber opening 10 in accordance with the principle of lever to release the lid 4 from the pod 2.

After the lid 4 is released, the upper end of the frame 5 enters the position of the opening 10. The movable portion 56 slightly lowers up to a position where the frame arms 12a and 12b can rotate. After the frame arms 12a and 12b lower, the frame arm 12 actually starts its rotation. That is, the rod 38 of the frame driving cylinder 35 extends and the frame arms 12a and 12b rotate until the frame 5 almost contacts with the circumference of the conveying-chamber opening 10. Then, the transmission sensors 9a and 9b set to the upside of the frame 5 exit to the outside from the conveying-chamber opening 10 and are inserted into the pod 2. At this point of time, the gas supply nozzle 21 is located at the position shown in FIG. 8A. Moreover, the first transmission sensors 9a and 9b constitute a detection space formed so that the wafers 1 are present on a straight line connecting the sensors 9a and 9b.

Under this state, movable portion 56 is vertically moved and at the same time, the contaminant removal operation and mapping operation of the wafer 1 by spraying high clean gas to each wafer 1 are successively executed. That is, the opener 3 is lowered up to the position shown in FIG. 13 by the rod-less cylinder 33. The transmission sensors 9a and 9b lower vertically to the face of the wafer 1 together with the movable portion 56 and opener 3. When the wafer 1 is present on a stage of a shelf, it shields the light emitted from the transmission sensor 9a while a wafer is missing from a stage of the shelf, the light emitted from the transmission sensor 9a is not shielded. Each sensor is set so that the transmission sensor 9b outputs a non-transmission signal when it is shielded by the wafer 1 and outputs a transmission signal when it is not shielded by the wafer 1.

Thereby, it can be determined that the wafer 1 is present when the non-transmission signal is detected and it can be determined that the wafer 1 is missing when the transmission signal is detected. It is possible to effectively perform the removal operation of contaminant or the like from each wafer by spraying clean gas on the wafer 1 from the gas supply nozzle 21 for a predetermined time at a predetermined pressure in response to this transmission signal. In this case, it is also allowed to stop spraying of high clean gas in accordance with the non-transmission signal by considering the use efficiency of the gas or change gas spraying conditions by considering that gas flow rates on a wafer to be operated are changed because intervals between wafers are different.

The sensor portion of the transmission sensor 8 is set so as to hold the concavo-convex portion 12 having cutouts at constant intervals set to the sensor dog 7. Therefore, when the movable portion 56 lowers, the transmission sensor 8 also lowers to detect the concavo-convex portion 12 of the sensor dog 7. In this case, when the transmission sensor 8 passes through a concave portion, the transmission sensor 8 is not light-shielded and it outputs a transmission signal but when the transmission sensor 8 passes through a convex portion, the transmission sensor 8 is light-shielded and it outputs a non-transmission signal. Therefore, by previously setting the concavo-convex portion 12 of the sensor dog 7 so that the point of time when the transmission sensors 9a and 9b pass through each stage of a shelf in the pod 2 corresponds to the point of time when the transmission sensor 8 passes through a concave portion,(a transmission or non-transmission signals detected by the transmission sensor 8 shows a signal of a stage of a shelf through which the transmission sensor 9 actually passes.

When the transmission sensor 8 detects a signal corresponding to a stage of a shelf and the transmission sensor 9a is light-shielded by comparing the above signal with a detection result of a transmission or non-transmission signal detected as a result of light-shielding of the transmission sensor 9a by the wafer 1, it can be determined that the wafer 1 is present on the shelf stage while the transmission sensor 9a is not light-shielded at that time, it can be determined that the wafer 1 is missing from the shelf stage. By changing high-clean-gas spraying timings or spraying conditions, it is possible to more effectively remove contaminant or the like. When the above operation is repeatedly applied to every wafer 1 and a support rod reaches the mapping completion position of the opener 3, the removal operation of contaminant or the like and mapping operation are completed.

Thereafter, when contracting the rod 38 of the frame opening/closing cylinder 35 again, the frame arms 12a and 12b rotate and the frame 5 moves so as to get away from the conveying-chamber opening 10. When the rod 38 is most contracted, movement of the frame 5 is completed. Then, the movable portion 56 moves down to the lowest point to complete a series of operations for releasing the lid 4, removing contaminant or the like to the wafer 1, and performing mapping. The above state is the state shown in FIG. 14.

As described above, in the case of this example, the gas supply nozzle 21 is fixed to the door 6 which moves in parallel with the direction in which wafers are superimposed. Therefore, it is possible to always supply clean gas to each wafer in the same condition. Moreover, by using the sensor dog 7 and transmission sensor 8, it is possible to easily generate a sync signal corresponding to a stage of a shelf in the pod 2. Therefore, it is possible to more effectively remove contaminant or the like simultaneously with the mapping operation of the wafer 1 without using a drive motor as a drive.

In the case of this example, the fulcrum of the door arm 42 and that of the mapping frame 5 are commonized by the fulcrum 41. However, the same advantage can be obtained even if using the both fulcrums as separate fulcrums. That is, the same advantage can be obtained even if using different fulcrums as a first fulcrum to be set on the door arm 42 and a second fulcrum to be set on a mapping frame. Though the movable portion 56, fulcrum 41, door opening/closing cylinder 31, and mapping-frame driving cylinder 35 are integrated, it is not always necessary to integrate them in order to obtain the advantage of the present invention. As long as these configurations are arranged at the downstream side of an air flow for the pod 2, the same advantage can be obtained.

In the case of this example, a gas supply nozzle is fixed to the upper portion of a door in order to apply the present invention without greatly changing a configuration according to the standard of FOUP. However, the present invention is not restricted to the above case. Specifically, it is also allowed to fix a gas supply nozzle to a different frame constituted of a door. Moreover, it is allowed to add a driving mechanism to a gas supply nozzle so that the gas supply nozzle can rotate about an axis parallel with a wafer face. Furthermore, it is considered that an attached state of contaminant or the like fluctuates in accordance with a processing performed immediately before. In this case, it is allowed to change the width, length, or angle of an opening of a gas supply nozzle or the number of openings in view of the attached state and use condition of gas. In this case, increase of the number of openings represents increase of the number of openings in the horizontal direction and increase of the number of openings in the vertical direction.

Moreover, in the case of this example, the removal operation of contaminant or the like is performed only once in accordance with the mapping operation. However, the present invention is not restricted to the above case. It is possible to always perform the removal operation except the case in which a robot arm in a conveying chamber accesses a wafer in a pod. Therefore, while various treatments are applied to a wafer in a treating apparatus, it is allowed to repeatedly apply the removal operation to a wafer held in a pod.

Furthermore, in the case of this example, a FOUP is described. However, an applied example of the present invention is not restricted to the system. As long as a system is used which includes a container for housing a plurality of objects to be held therein and a conveying chamber for conveying an object to be held from the container to an apparatus for treating the object to be held, it is possible to apply a removing apparatus (purging apparatus) of contaminant or the like of the present invention to the system.

The invention claimed is:

1. A purging apparatus for purging objects housed in a pod including, a body including an opening and a plurality of shelves arranged in a predetermined direction on which the objects to be housed are mounted, and a lid configured to be removed from the body and to close the opening, the purging apparatus purging the objects by spraying a predetermined gas on the objects to be housed, comprising:

a frame configured to move relative to the front of the opening in the predetermined direction while the lid is separated from the body;

a door configured to hold the lid, to separate the lid from the body, and to couple the lid to the body by moving independently from and relative to the movement of the frame; and a gas supply nozzle movable in the predetermined direction by keeping a predetermined positional relation with the frame, wherein the frame holds a sensor for mapping the object housed in the pod, and the frame inserts the gas supply nozzle into the body of the pod when the door separates the lid from the body.

2. The purging apparatus according to claim 1, wherein the gas supply nozzle is set in parallel with the sensor.

3. The purging apparatus according to claim 1, wherein the timing at which the predetermined gas is spouted from the gas supply nozzle synchronizes with the timing at which the gas supply nozzle passes through a plane on which the object to be housed extends when moving in the predetermined direction.

4. The purging apparatus according to claim 1, wherein the gas supply nozzle spouts the predetermined gas in a direction parallel with the plane on which the objects to be housed extend or a direction facing downward by a predetermined angle from the plane.

5. The purging apparatus according to claim 1, wherein the objects to be housed are wafers used for semiconductor fabrication and the state in which the lid is separated from the body is the state in which the pod is mounted on a load port and the wafers housed in the pod are transferred to a wafer treating apparatus through the load port.

6. A purging apparatus for purging an object housed in a pod including, a body including an opening and a plurality of shelves arranged in a predetermined direction on which objects to be housed are arranged, and a lid configured to be separated from the body and to close the opening, the purging apparatus purging the objects by spraying a predetermined gas on the objects to be housed, comprising:
 a gas supply nozzle separated from ends of the objects to be housed by a predetermined distance and configured to spray the predetermined gas on an area of a face extending vertically to the predetermined direction of the objects to be housed; and
 a support member that supports the gas supply nozzle and is configured to drive the gas supply nozzle in the predetermined direction;
 a sensor movable in the predetermined direction with the support member, the sensor detecting a timing at which the support member passes through a plane on which each of the objects to be housed extends when the support member moves in the predetermined direction,
 wherein the support member is a member for setting or removing the lid to or from the body portion of the pod, and the gas supply nozzle sprays the predetermined gas on the object while the support member holds the lid, and
 the gas supply nozzle sprays the predetermined gas onto the plane in synchronization with the timing.

7. The purging apparatus according to claim 6, wherein the gas supply nozzle spouts the predetermined gas to an area surrounded by a face parallel with a plane on which the objects to be housed extend and a face extended by facing downward by a predetermined angle from the plane.

8. The purging apparatus according to claim 6, wherein the objects to be housed are wafers used for semiconductor fabrication and the state in which the lid is separated from the body is the state in which the pod is mounted on a load port and the wafers housed in the pod are transferred to a wafer treating apparatus through the load port.

9. A purging method for purging objects housed in a pod including, a body including an opening and a plurality of shelves arranged in a predetermined direction on which the objects to be housed are mounted, and a lid removable from the body and configured to close the opening, the purging method purging the objects by spraying a predetermined gas to the objects to be housed, comprising:
 a step of separating the lid from the body via a door which is configured to hold the lid, to separate the lid from the body, and to set the lid to the body;
 a step of moving a gas supply nozzle along the predetermined direction at the front of the opening independently from and relative to movement of the door, after the door removes the lid from the body; and
 a step of purging the objects to be housed by spraying the predetermined gas on the objects to be housed from the gas supply nozzle,
 wherein the gas supply nozzle is set in parallel with the sensor, and after removing a lid, a step of mapping the object by the sensor is performed simultaneously with the step of performing purging in a state in which the gas nozzle is inserted into the body.

10. The purging method according to claim 9, wherein the step of performing the purging is performed synchronously with the timing at which the gas supply nozzle passes through the plane on which the objects to be housed extend when moving in the predetermined direction.

11. The purging method according to claim 9, wherein in the step of performing the purging, the gas supply nozzle spouts the predetermined gas in a direction parallel with the plane on which the objects to be housed extend or a direction facing downward by a predetermined angle from the plane.

12. The purging method according to claim 9, wherein the objects to be housed are wafers used for semiconductor fabrication and the state in which the lid is separated from the body is the state in which the pod is mounted on a load port and the wafers housed in the pod are transferred to a wafer treating apparatus through the load port.

13. A purging method for purging objects housed in a pod including, a body including an opening and a plurality of shelves arranged in a predetermined direction on which the objects to be housed are mounted, and a lid removable from the body and configured to close the opening, the purging method purging the objects by spraying a predetermined gas to the objects to be housed, comprising:
 a step of separating the lid from the body;
 a step of holding a state in which the front of the opening is separated from ends of the objects to be housed by a predetermined distance and moving a gas supply nozzle in the predetermined direction; and
 a step of purging the object to be housed by spraying the predetermined gas on an area of a face extending in a direction vertical to the predetermined direction of the objects to be housed,
 wherein the gas supply nozzle is fixed to a door used to set or remove the lid to or from the body of the pod, and after separating the lid from the body by the door, the gas is sprayed onto each of objects subsequently in accordance with the movement of the door, and
 the step of purging includes a step of detecting, via a sensor, a timing at which the gas supply nozzle passes through a plane on which each of the objects to be housed extends when the gas supply nozzle moves in the predetermined direction, and a step of spraying the predetermined gas from the gas supply nozzle onto the plane respectively in synchronization with the detected timing.

14. The purging method according to claim 13, wherein in the step of purging, the gas supply nozzle spouts the predetermined gas between a face parallel with a plane on which the objects to be housed extend and face extended by facing downward by a predetermined angle from the plane.

15. The purging method according to claim 13, wherein the objects to be housed are wafers used for semiconductor fabrication and the state in which the lid is separated from the body is the state in which the pod is mounted on a load port and the wafers housed in the pod are transferred to a wafer treating apparatus through the load port.

* * * * *